United States Patent [19]
Yang et al.

[11] Patent Number: 5,469,366
[45] Date of Patent: Nov. 21, 1995

[54] METHOD AND APPARATUS FOR DETERMINING THE PERFORMANCE OF NETS OF AN INTEGRATED CIRCUIT DESIGN ON A SEMICONDUCTOR DESIGN AUTOMATION SYSTEM

[75] Inventors: Dian Yang, Milpitas; Hashain Karampurwala, San Jose, both of Calif.

[73] Assignee: LSI Logic Corporation, Milpitas, Calif.

[21] Appl. No.: 124,094

[22] Filed: Sep. 20, 1993

[51] Int. Cl.[6] .................................................. G06F 17/50
[52] U.S. Cl. ........................... 364/489; 364/488; 364/490; 364/578
[58] Field of Search ..................... 364/488, 489, 364/490, 491, 149, 150, 151, 300, 578; 307/303.1

[56] References Cited

U.S. PATENT DOCUMENTS

| | | | |
|---|---|---|---|
| 4,500,963 | 2/1985 | Smith et al. | 364/300 |
| 4,554,625 | 11/1985 | Otten | 364/148 |
| 4,593,363 | 6/1986 | Burstein et al. | 364/491 |
| 4,612,618 | 9/1986 | Pryor et al. | 364/490 |
| 4,630,219 | 12/1986 | DiDiacomo et al. | 364/488 |
| 4,688,072 | 8/1987 | Heath et al. | 357/45 |
| 4,918,614 | 4/1990 | Modarres et al. | 364/490 |
| 5,164,907 | 11/1992 | Yabe | 364/491 |
| 5,218,551 | 6/1993 | Agrawal et al. | 364/491 |
| 5,237,514 | 8/1993 | Curtin | 364/490 |
| 5,305,229 | 4/1994 | Dhar | 364/489 |

FOREIGN PATENT DOCUMENTS

| | | | |
|---|---|---|---|
| 0133466A2 | 2/1985 | European Pat. Off. | 23/52 |
| WO90/053 | 5/1990 | WIPO | 15/60 |

OTHER PUBLICATIONS

"A Linear-Time Heuristic For Improving Nerwork Partitions", by Fiduccia, Manuscript, Apr. 1982, 7 pages.
"Improvements of a Mincut Partition Algorithm", by Ng et al., CH2469-May 1987, IEEE, pp. 470-473.
"Clustering Based Simulated Annealing for Standard Cell Placement", by Mallela, 25th ACM/IEEE Design Automation Conference, 1988, pp. 312-317.
"Proud: A Fast Sea-Of-Gates Placement Algorithm", by Tsa et al., 25th ACM/IEEE Design Automation Conference, 1988, pp. 318-323.
"Finding Clusters in VLSI Circuits", by Garbers et al., IEEE, 1990, pp. 520-523.
"An Efficient Placement Method for Large Standard-Cell and Sea-Of-Gates Designs", by Kappen et al., IEEE, 1990, pp. 312-316.

(List continued on next page.)

*Primary Examiner*—Kevin J. Teska
*Assistant Examiner*—Tyrone V. Walker
*Attorney, Agent, or Firm*—Albert C. Smith

[57] ABSTRACT

A technique is described which is generally directed to providing better delay determination for "nets" (equivalent circuits of point-to-point wiring) in integrated circuit designs on a semiconductor design automation system by adapting general RC-mesh networks representing those "nets" to efficient nodal matrix circuit solver techniques which are not inherently suited to general RC-mesh circuits. This is accomplished by "collapsing" the general RC-mesh network into an RC-tree equivalent circuit (network) which can be solved (simulated) by such nodal matrix techniques, thus determining node voltages and waveforms for each of the nodes of the simplified network. After solving the simplified network, the simplified network is re-expanded into its original RC-mesh form, determining the node voltages and waveforms at the re-expanded nodes thereof (eliminated during the collapse of the network) by applying simple circuit analysis techniques. Once all of the node waveforms have been re-constructed for all nodes of the original RC-mesh network, they can be compared against critical threshold voltages to determine net delays to each node of the network. Method and apparatus are described.

37 Claims, 7 Drawing Sheets

OTHER PUBLICATIONS

"Gordian: VLSI Placement by Quadratic Programming and Slicing Optimization", by Kleinhans et al., IEEE Transactions on Computer–Aided Design, vol. 10, No. 3, Mar. 1991, pp. 356–365.

"New Spectral Methods for Ration Cut Partitioning and Clustering", by Hagen et al., IEEE Transactions on Computer–Aided Design, vol. 11, No. 9, Sep. 1992, pp. 1074–1085.

"Net Partitions Yield Better Module Partitions", by Cong et al., 29th ACM/IEEE Design Automation Conference, 1992, pp. 47–52.

"Gordian: A New Global Optimization/Rectangle Dissection Method for Cell Placement", by Kleinhans et al., pp. 506–509.

"A New Optimization Driven Clustering Algorithm For Large Circuits", by Ding et al., Oct. 26, 1992, pp. 1–7.

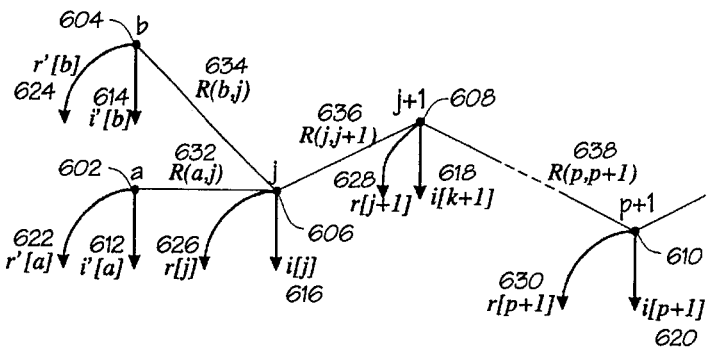

METHOD AND APPARATUS FOR DETERMINING THE PERFORMANCE OF NETS OF AN INTEGRATED CIRCUIT DESIGN ON A SEMICONDUCTOR DESIGN AUTOMATION SYSTEM

TECHNICAL FIELD OF THE INVENTION

The invention relates to semiconductor design automation systems, more particularly to the simulation of integrated circuit designs on such systems, and more particularly to the accurate determination of net (wiring) performance for such integrated circuit designs.

BACKGROUND OF THE INVENTION

Development of a working integrated circuit chip is a process that involves creating a design specification, creating the logical design of the chip (typically in schematic form), validating the design, re-designing as necessary, fabricating the chip and testing the chip. Costs tend to be "end-loaded," i.e., greater towards the end of the process than towards the beginning. The earlier in this process that a design error is detected, the earlier it can be corrected, saving a great deal of cost over a late-detected error. As a result, increasingly sophisticated steps are being taken to validate the design of a new chip, as early in the design process as possible.

Design validation requires thorough examination of the integrated circuit design and expected functional characteristics, taking into account a number of different factors, such as logical correctness of the design, timing factors (including net delay performance, power dissipation, effects of parasitic capacitances, etc.) Among these factors, net performance (specifically, net delay) is one of the most important. Many timing-related problems have been discovered in chips whose designs appear to be "logically" correct, at least on paper. This is because it is difficult for the designer to anticipate such delay contributors as wiring delays (net delays) and the cumulative effects of distributed resistances and capacitances on the chips, especially from a post-layout point of view. The accuracy of delay determination affects not only the chip performance, but whether a chip meets its original design specification.

Virtually all integrated circuit designers today use semiconductor design automation systems which facilitate the capture, simulation, layout, and verification of integrated circuit designs. With the advance of semiconductor process technology, integrated circuits are becoming increasingly fast, and the relatively small delays caused by interconnections (wiring) on a chip are becoming a more dominant factor in integrated circuit performance. As a result, the ability to accurately model and calculate wiring delays (net delays) is becoming a crucial requirement for any semiconductor design automation system. These small wiring delays (i.e., the time required for a critical threshold voltage at a receiving node to be crossed after the application of a driving signal at a driving node) are known as "net delays".

One of the by-products of an integrated circuit design on a semiconductor design automation system is a "net-list" which contains a complete description of all of the devices (e.g., transistors, resistors, etc.) required, and how they are connected. The connections are described in the form of "nets" (short for "networks") or descriptions of the point-to-point wiring connections between components. A single net may connect to many components. Any chip design will have a great number of nets. The net-list includes a list of net interconnections, thus the name "net-list".

From any driving point to any receiving point on a net, there is an associated delay. This time is due to a complicated combination of parasitic capacitances, wiring resistances, wire lengths, etc.. Some nets have multiple drivers (e.g., a number of open-drain or tri-state drivers), or loops (e.g., clock rings) making their (accurate) analysis particularly complicated. The delay for a net is determined by modeling the net and analyzing the delay according to the model. One of the most serious problems in delay calculation (determination) is that accurate models tend to complicate delay calculations, resulting in very long delays in the design cycle while computation-intensive net delays are being calculated. As a result, most prior-art net delay calculation techniques compromise on the accuracy (faithfulness to reality) of the model of the net in order to decrease the amount of calculation time required. Unfortunately, in doing so most such techniques sacrifice enough accuracy that the results of delay calculation are only very rough approximations of actual chip performance. As a result, many chips, particularly those with complicated timing relationships between signals, have subtle timing-related problems when they are built. The designs of such chips must then be altered, re-simulated, etc., and a new chip must be fabricated. This process is extremely costly.

In the prior art, techniques such as the modified upper-lower bound method are used to calculate interconnect delay. The upper-lower bound method is described in J. Rubenstein, P. Penfield, and M. A. Horowitz, "Signal Delay in RC Tree Networks," IEEE Trans. Computer-Aided Design, vol CAD-2, pp 202–211, 1983. This method computes adequate results for many nets, and is efficient in computing time. For some large nets, multiple-driver nets, and nets with loops (i.e., clock rings), however, it does not perform well, providing delay estimations which differ significantly from reality. In such cases, more accurate and sophisticated computational methods are required to achieve the necessary accuracy. However, the conventional SPICE method to achieve accurate results takes enormous computation time and is impractical to incorporate into a semiconductor design automation system. (SPICE is the name of a commonly-used analog circuit simulation technique for digital computers).

In 1990, L. Pillage and R. Rohrer from CMU proposed a new method called "Asymptotic Waveform Evaluation", hereinafter "AWE", which is based on the frequency domain analysis, to simulate the waveform response of a circuit (see L. Pillage and R. Rohrer, "Asymptotic Waveform Analysis for Timing Analysis," IEEE Trans. Computer-Aided Design, April, 1990, appended hereto). The AWE method is an iterative "state-transition matrix" technique, that is, it makes use of a vector-matrix multiplication technique to determine voltages at various points along a net in discrete-time fashion. Iterative matrix multiplication techniques are well known to those of ordinary skill in the art. Crucial to the AWE method is the efficient determination of "moments", which are used to create the matrix coefficients. The AWE method is 1000 to 100,000 times faster than SPICE (when compared on the same digital computer) and for nets without loops (i.e., RC-tree), it can achieve very accurate results. However, it is not suited to generalized RC-mesh problems, because it cannot handle loops. Since the interconnect portion of an integrated circuit chip design is essentially a generalized RC-mesh circuit, and some signals on an integrated circuit (e.g., a clock distribution network) contain loops, the AWE method, is not well suited to general-purpose delay determination in semiconductor design automation systems.

SOME TERMINOLOGY

Net:
A "net" is an interconnection path on an integrated circuit. A net typically connects one or more circuit outputs (driving points or nodes) to one or more circuit inputs (receiving points or nodes). Each junction along a net is called a "node". Each length of a net between two nodes has an associated wiring resistance which appears as a series resistance between the two nodes.

Node:
A junction within a net or a net endpoint (driving point or receiving point).

Net Endpoint:
A node which connects to only one other node in a net.

Interior Node:
A node which connects to two or more other nodes in a net.

Driving Node:
A net connection to the output of a circuit.

Receiving Node (also "leaf" node):
A net endpoint which is not driven.

Net Delay:
The amount of time required for the voltage at a receiving node on a net to cross a critical logic threshold voltage after the application of a driving signal at a driving node on the same net.

Branch:
A branch of a net is a "sub-net" beginning at a "root" or origin node.

Superbranch (SB):
A superbranch (SB) for a general RC-mesh network is a branch of a net starting at a first "root" node and formed such that subsequent nodes form a subtree (which may include "forks", but may not loop back onto itself at any point), no node of which has a grounded resistance. A superbranch can be eliminated (collapsed to a single equivalent node) without affecting the remainder of the network, except in that the "root" node of the superbranch (the node to which the SB is collapsed) will have a change of equivalent resistance and a current change to account for currents in the eliminated (collapsed) nodes of the SB.

Generalized Superbranch (GSB):
A generalized superbranch (GSB) is the same as a superbranch, except that grounded resistances may exist at one or more nodes of a GSB.

Superpath (SP):
A superpath (SP) is a simple path between two branch nodes such that each intermediate node along the path is of connects to exactly two other nodes (i.e., the path does not "fork" at any node) and has no grounded resistances.

Branch Node (BN):
A branch node (BN) is one of two end nodes of a superpath.

DISCLOSURE OF THE INVENTION

It is therefore an object of the present invention to provide a technique for determining the performance of nets of an integrated circuit design which is compatible with general RC-mesh network topologies.

It is another object of the present invention to provide a technique for determining the above object using a nodal-matrix simulation technique.

It is another object of the present invention to provide a technique of collapsing general RC-mesh network topologies into equivalent simplified networks (circuits) suitable for simulation using nodal matrix techniques.

It is another object of the present invention to provide efficient means for determining node voltages for nets of an integrated circuit design.

It is another object of the present invention to provide efficient means for determining net delays for the nets of an integrated circuit design.

According to the invention, better performance (delay or node voltage) determination for "nets" (equivalent circuits of point-to-point wiring) in integrated circuit designs on a semiconductor design automation system is provided by adapting general RC-mesh networks representing those "nets" to efficient nodal matrix circuit solver techniques which are not inherently suited to general RC-mesh circuits. This is accomplished by "collapsing" the general RC-mesh network into an RC-tree equivalent circuit (network) which can be solved (simulated) by such nodal matrix techniques, thus determining node voltages and waveforms for each of the nodes of the simplified network. After solving the simplified network, the simplified network is re-expanded into its original RC-mesh form, determining the node voltages and waveforms at the re-expanded nodes thereof (eliminated during the collapse of the network) by applying simple circuit analysis techniques. Once all of the node waveforms have been re-constructed for all nodes of the original RC-mesh network, they can be compared against critical threshold voltages to determine net delays to each node of the network.

Nets (networks) are reduced according to their connection topology. Generalized RC-mesh networks differ from RC-tree networks in that they can contains loops. Nodal matrix methods which operate on RC-tree (branch) networks, such as AWE, are not capable of handling loops, and so are not generally suited to RC-mesh analysis. The terminology defined hereinabove with respect to network topology will prove useful in the following descriptions with respect to the present inventive technique.

In one embodiment of the present invention, the performance of nets of an integrated circuit design is determined by providing an integrated circuit design on a semiconductor design automation system. The integrated circuit design contains a net-list, which contains descriptions of net connectivity for the integrated circuit design. Nets consist of a series of interconnected nodes. Each net is collapsed to a corresponding simplified equivalent circuit having a smaller number of "simplified" nodes and the resultant simplified equivalent nets (circuits) are simulated, thereby determining a node voltage waveform for each simplified node.

While this embodiment does not give any information about the "collapsed" nodes of the nets, it is useful for determining some overall performance information about the integrated circuit, since "simplified" nodes still represent actual points on the integrated circuit design. Further, a node voltage "waveform" is simply repeated node voltage determinations observed at the same node for different times. As a result, "node voltages" and "node voltage waveforms" are used herein as being roughly equivalent with respect to simulation.

In another embodiment of the present invention, the node voltage waveform for each simplified node is compared against a threshold value to determine a net delay for that simplified node.

In another embodiment of the present invention, the simplified equivalent circuit corresponding to each net is re-expanded, and a node voltage is determined during the process of re-expanding for each re-expanded node of each re-expanded net. In this manner, full node and net performance information about all nodes of the integrated circuit design may be obtained from a simulation run on a simplified equivalent of the design.

In another embodiment of the present invention, the node voltage waveform for each re-expanded node is compared against a threshold value to determine a net delay for each such node. This makes complete net delay information available for each node of each net.

In another embodiment of the present invention, the process of collapsing the network comprises the following steps:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes.

In another embodiment of the present invention, the process of re-expanding the simplified equivalent circuits comprises the following steps:

re-expanding each superpath of each net from the simplified equivalent circuit associated with each such superpath, thereby determining a node voltage waveform for each superpath node of each such superpath;

re-expanding each generalized superbranch of each net from the simplified equivalent circuit associated with each such generalized superbranch, thereby determining a node voltage waveform for each generalized superbranch node of each such generalized superbranch; and re-expanding each superbranch of each net from the simplified equivalent circuit associated with each such superbranch, thereby determining a node voltage waveform for each node of each such superpath.

Other similar embodiments are directed to specific techniques for collapsing and/or re-expanding superbranches (SB's) generalized superbranches (GSB's), and superpaths (SP's).

Another embodiment of the present invention provides a system for determining the performance of nets of an integrated circuit design, comprising a semiconductor design automation system, an integrated circuit design on the semiconductor design automation system, network collapsing software and network simulation software. The semiconductor design automation system includes a computer processor, a graphic display device connected to the computer processor, and one or more mass-storage devices accessible to the computer processor. The integrated circuit design includes a net-list which itself includes a plurality of nets, each net representing a plurality of interconnected nodes. The network collapsing software operates to collapse nets in the net-list to corresponding simplified equivalent circuits having a smaller number of simplified nodes. The network simulation software operates to determine node voltages for each of the simplified nodes.

Another embodiment of the present invention adds network re-expansion software to the semiconductor design automation system. The network re-expansion software operates to re-expand nets collapsed into corresponding simplified equivalent circuits, and to determine a node voltage for each node of each such re-expanded net.

Other objects, features and advantages of the present invention will become evident in light of the following detailed description thereof.

BRIEF DESCRIPTION OF THE DRAWINGS

FIG. 1b is a simplified representation of the simple RC circuit of FIG. 1a.

FIG. 4b is a node connectivity graph of a simplified equivalent network resulting from the collapse of the network of FIG. 4a.

FIGS. 6a–6d are node connectivity graphs of a representative "forked" generalized superbranch network at various stages in a collapse process.

FIG. 8b is a schematic diagram of a circuit resulting from the collapse of the circuit of FIG. 8a.

FIG. 9b is a schematic diagram of a circuit resulting from the collapse of the circuit of FIG. 9a.

DETAILED DESCRIPTION OF THE INVENTION

Figure 1A:
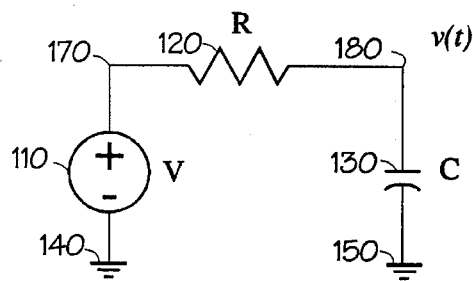
FIG. 1a is a schematic of simple RC circuit.

The present invention determines delays for nets in an integrated circuit design on a semiconductor design automation system. In order to adapt generalized RC-mesh networks such as those which occur in integrated circuit design net lists on semiconductor design automation systems to a form suited to analysis by such techniques as the AWE method, it is necessary to provide an efficient method for finding moments in an RC-mesh network. This is accomplished in the present invention by reducing the network to an equivalent DC network. This reduction of the network is based upon the concept that a circuit may be simplified by collapsing "superbranches" (defined above) and collapsing "superpaths" (also defined above) to produce a simplified DC equivalent network, then using a general nodal matrix method to solve the simplified DC problem. For most chip-level nets, there will be relatively few nodes remaining after simplifying the circuit (collapsing). This means that nodal matrix sizes are expected to be small, reducing the amount of matrix computation required and making the analysis simpler and faster. For a typical integrated circuit design, 95% of the nets can be simplified by only performing "superbranch" collapsing (i.e., RC-tree). For some 4% of the nets, the reduced circuit should have a size of less than four collapsed nodes.

When modeling a net, lengths of metal (on-chip wiring) are typically modeled as resistances. Logic gate inputs (usually one or more FET gates) tend to appear at nodes as grounded capacitances.

Hereinbelow, the AWE method is used as a representative technique for analyzing RC-tree type networks. Since the AWE method is used in this specification as being exemplary of network analysis techniques, it is described hereinbelow for clarity and as a basis for better understanding of the present inventive technique.

AWE Overview

The AWE method is a frequency domain (Laplace) method characterized by efficient moment computation for certain types of networks. The moments are used to determine a frequency domain transfer function for the network, then residues are used to determine the time domain response of the network. Iterative matrix calculation techniques are then used to determine time-domain waveforms at specific points (nodes) within the network.

Since AWE is an iterative technique which determines values in a discrete time fashion, a notational convenience is needed to distinguish between node numbers and iteration numbers for moments, voltages and currents. In the following discussion, iteration numbers will always be subscripted and node numbers will always be placed in parentheses. For example $I_1(2,3)$ refers to the current flowing from node 2 to node 3 at the time of iteration number 1. Resistors are similarly notated with the numbers of the nodes they interconnect. That is R(3,4) refers to a resistor from node 3 to node 4. A resistor followed by a single number in brackets (e.g., R[10]) refers to a resistor connected from the node with that number to ground. Similarly, a current followed by a single number in brackets is a ground current from the node number equal to the subscript, e.g., I[5] is a current from node number 5 to ground. All node voltages are measured with respect to ground.

In a typical computer-based semiconductor design automation system, net lists are, in part, stored lists of interconnected "nodes" each of which has a reference number or tag of some sort. Hereinafter, node numbers are used with respect to various Figures and examples. These nodes are numbered sequentially, starting with 0. The node numbers used are consistent only within an example. Node numbers are not unique to a particular net. For example, two separate nets "A" and "B" may each have nodes numbered 1, 2, 3, 4, 5 . . . , 10, but node 1 in net list "A" has no relationship, implied or otherwise, to node 1 in net list "B" node 2 in net list "A" has no relationship to node 2 in net list "B" etc. In the Figures, node numbers are identified as n"x" where "x" is the node number, e.g., n5 refers to node number 5.

Further, in order to facilitate the mathematical formulae discussed hereinbelow with respect to iterative techniques, it is necessary to assign such sequential "counting numbers" to the nodes. For this reason, different pictorial representations of different node networks will have common node numbers. No association between nodes of different Figures should be assumed unless explicitly stated. A node number, then, should be considered as nothing more than a position in a node list which may be used over and over again in representing different nets.

The key to the speed of the AWE method is very fast calculation of moments. The AWE method approximates a network to be analyzed in the frequency domain. For purposes of analysis, a signal h(t) having a Laplace transform H(s) (a frequency domain representation of h(t)) is assumed, i.e.:

$$H(s) = \int_0^\infty h(t)e^{st}dt \qquad (1)$$

A rational frequency domain function G(s)=P(s)/Q(s) is assumed, where P(s) has degree m, Q(s) has degree n, and G(s) is an m+n degree approximation of H(s), i.e.:

$$\frac{d^i H(s)}{ds^i} = \frac{d^i G(s)}{ds^i} \text{ at } s=0; \text{ for } i=0,1,\ldots,m+n \qquad (2)$$

Then g(t), the inverse Laplace transform of G(s), matches h(t) up to m+n "moments". Therefore, g(t) can be used to approximate h(t). The AWE-based method generates G(s) in a two step process:

1) Expand H(s) as a Taylor series:

$$H(s) = \sum_{k=0}^\infty \frac{1}{k!}(-s)^k \int_0^\infty t^k h(t)dt \qquad (3)$$

and $$m_k = \frac{(-1)^k}{k!} \int_0^\infty t^k h(t)dt$$

where $m_k$ is the $k^{th}$ moment.

2) Next, express G(s) as a summation series, according to:

$$G(s) = \frac{k_1}{s-p_1} + \frac{k_2}{s-p_2} + \ldots + \frac{k_q}{s-p_q} \qquad (4)$$

where $k_1, k_2, \ldots, k_q$ are zeros and $p_1, p_2, \ldots, p_q$ are poles.

From h(t), the moments for H(s) can be determined, and from the moments of H(s), the zeros and poles can be determined. Since the zeros and poles of the approximation, G(s) are known, then g(t) may be expressed as:

$$g(t) = k_1 e^{p_1 t} + k_2 e^{p_2 t} + \ldots + k_q e^{p_q t} \qquad (5)$$

One simple example

A simple example of AWE moment calculation is given in the following analysis of the simple RC circuit of FIG. 1a.

FIG. 1a is a schematic diagram of a simple RC circuit comprising a voltage source 110, a resistor 120 and a capacitor 130. A negative side of the voltage source 110 connects to ground 140. A positive side of the voltage source 110 connects to one side of resistor 120 (R) via node 170. The other side of the resistor 120 is connected to one side of a capacitor 130 (C) via a node 180. A voltage v(t) at node 180 is to be determined by AWE analysis. The other side of the capacitor is connected to ground 150. (For the purpose of this analysis, grounds 140 and 150 may be considered to be the same ground reference point, against which v(t) is measured).

V(t) 110 is assumed to be a step voltage source such that:

$$V(t) = \begin{cases} 0; & t < 0 \\ 1; & t \geq 1 \end{cases} \qquad (6)$$

The following expression with respect to node 180 may be set forth:

$$\frac{dv(t)}{dt} = -\frac{1}{RC} v(t) + V(t) \qquad (7)$$

Figure 1B:
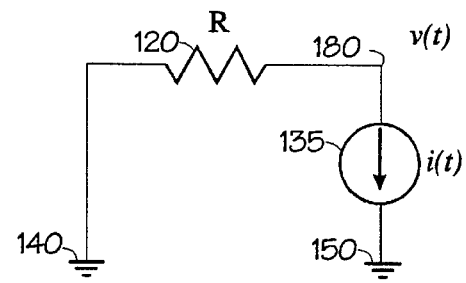

FIG. 1b is a schematic diagram of an AC equivalent circuit of the circuit of FIG. 1a. In FIG. 1b, the DC voltage source 110 is eliminated (replaced with a wire), and the capacitor 130 is replaced with a current source 135 whose current at any time is expressed by a time domain function i(t).

The loop equation for the circuit of FIG. 1b is:

$$0 - v(t) = i(t)R \qquad (8)$$

By conventional engineering circuit analysis, v(t) is given by:

$$v(t) = 1 - e^{-\frac{t}{RC}} \qquad (9)$$

The Laplace transform of v(t) is:

$$\mathcal{L}(v) = \int_0^{-\infty} v(t)e^{-st}dt = \int_0^{-\infty} (1 - e^{-\frac{t}{RC}}) e^{-st}dt \qquad (10)$$

$$= \left(\frac{1}{s}\right) - \frac{1}{\frac{1}{RC} + s}$$

$$= \frac{1}{x} - RC \sum_{k=0}^{-\infty} (-RC)^{k+1} s^k$$

$$= \frac{1}{x} + \sum_{k=0}^{-\infty} (-RC)^{k+1} s^k$$

so, from equation (3), the moments are:

$$m_0 = RC$$
$$m_1 = (RC)^2$$
$$m_2 = (RC)^3$$
$$\vdots$$
$$m_k = (RC)^{k+1}$$

For AWE, $m_{-1} = 1$ is assumed. Given that $m_{k-1}$ is known, the following method may be used to calculate $m_k$:

$i(t) = m_{k-1} * C$
$v(t) = -i(t)R = -m_{k-1} * RC$
$m_k = v(t) = -m_{k-1} * RC$
therefore:
$m_k = (-RC)^{k+1}$ AWE Computational Components The AWE method consists of four basic computational components:

1) Moment calculation;
2) Pole calculation;
3) Residue calculation; and
4) Node waveform determination.

(When AWE is applied to a delay determination problem, it is further necessary to determine the delay by examining the node waveform for crossings of critical logic threshold voltages).

The discussion hereinbelow gives some theoretical foundation for moment calculation, pole calculation and residue calculation. (Node waveform computation simply reconstructs the waveform from the information derived from the first three computational components using standard mathematical techniques). With respect to the discussion hereinbelow, all nodes are referred to by an arbitrary node number. These numbers are used for illustrative purposes only and specific node numbers are not essential to the method or to the results.

Moment Calculation

Given a linear network (e.g., an RC-tree network), a state equation describing the (multi-dimensional) time domain response of the network can be expressed as:

$$C\vec{v} = G\vec{v} + \vec{b} \qquad (11)$$

where v is a vector of node voltages at "n" nodes, C is a (diagonal) matrix and G is a node conductance matrix having matrix terms g(i,j). G and b can be expressed as:

$$g(i,j) = -\sum_{j\text{-nodes}^1} \frac{1}{R(i,j)} - \sum_{j\text{-nodes}^2} \frac{V_j}{R(i,j)} \qquad (12)$$

$$g(i,j) = \begin{cases} 0 & \text{if } j \text{ is not a neighboring node of } i \\ \frac{1}{R(i,j)} & \text{if } j \text{ is a neighboring node of } i \end{cases}$$

$$b(i) = \sum_{j\text{-nodes}^2} \frac{V_j}{R(i,j)}$$

where j-nodes[1] are those nodes for which node "j" is a neighboring node of node "i", and j-nodes[2] are those nodes for which node "j" is a voltage source node and is a neighboring node of node "i".

Equation (11) may be rewritten as:

$$\vec{v}' = A\vec{v} + \vec{f} \qquad (11)$$

where $$A = C^{-1}G \qquad (14)$$

and $$\vec{f} = C^{-1}\vec{b} \qquad (15)$$

Laplace transformation yields:

$$s\vec{w} - \vec{v} = A\vec{w} + \vec{F} \qquad (16)$$

where $$\vec{w} = \mathcal{L}(v) \qquad (17)$$

and $$\vec{F} = \mathcal{L}(\vec{f}) \quad (18)$$

The moments can be calculated by the following iterative method:

$$\vec{m}_{k+1} = A^{-1}\vec{m}_k \quad (19)$$

where $m_{-1} = -v_h(0)$. "$v_h(0)$" is generally chosen to be the stable solution for the circuit, where all capacitances have an initial unit voltage across them.

From equations (15) and (20):

$$Cm_k - Gm_{k+1} \quad (20)$$

To calculate $m_{k+1}$, all capacitances are replaced by current sources, where the current is equal to $Cm_k$. The driving node (input node) is connected to ground. In a pure RC tree (no loops and no multiple drivers), the moment may be calculated in two tree "walks" (passes). The first tree walk calculates all branch currents, which can be done iteratively in a bottom-up manner. The second tree walk calculates all node voltages (moments), which can be done iteratively in a top-down manner.

Figure 2:
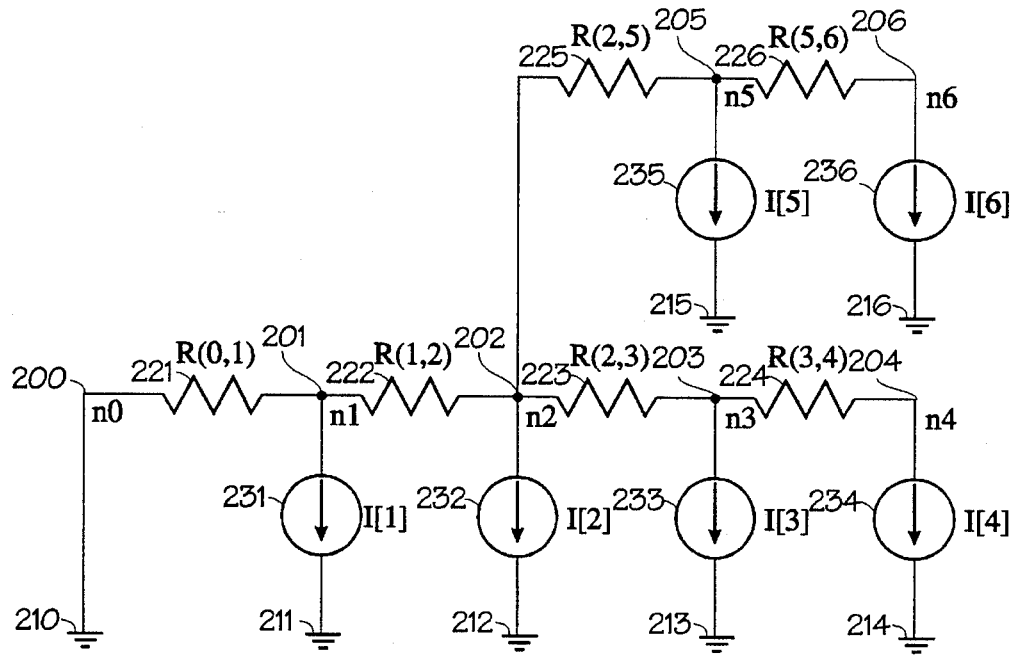
FIG. 2 is a schematic of an RC branch circuit having superbranch topology.

FIG. 2 is a schematic diagram of a representative RC tree having no loops comprising six resistors 221, 222, 223, 224, 225, and 226 (R(0,1), R(1,2), R(2,3), R(3,4), R(2,5), and R(5,6), respectively) and six grounded node capacitances modeled as current sources 231, 232, 233, 234, 235, and 236 (I[1], I[2], I[3], I[4], and I[6], respectively.) The resistor numbers include the "from" node number and the "to" node number, i.e., R(0,1) connects node 0 (200) to node 1 (201), etc. Current source numbers refer to the node to which they are connected, e.g., I[1] is a current source from node 1 (201) to ground 211. Seven ground reference points, 210, 211, 212, 213, 214, 215, and 216, are all at the same potential, and for the purposes of the example, may be considered as being connected to the same point. A grounded node 200 (node 0), represents a driving point replaced with a connection to ground reference point 210. A resistor 221 (R(0,1)) connects between node 200 (node 0) and another node 201 (node 1). A current source 231 (I[1]) connects between node 201 (node 1) and a ground reference point 211. A resistor 222 (R(1,2)) connects between node 201 (node 1) and a node 202 (node 2). Another current source 232 (I[2]) connects between node 202 (node 2) and a ground reference point 212. A resistor 223 (R2,3) connects between node 202 (node 2) and a node 203 (node 3). A resistor 225 (R(2,5)) connects between node 202 (node 2) and a node 205 (node 5). A current source 233 (I[3]) connects between node 203 (node 3) and a ground reference point 213. Another current source 235 (I[5]) connects between node 205 (node 5) and a ground reference point 215. A resistor 224 (R(3,4)) connects between node 203 (node 3) and a node 204 (node 4). A resistor 226 (R(5,6)) connects between node 205 (node 5) and a node 206 (node 6). A resistor 224 (R(3,4)) connects between node 203 (node 3) and a node 204 (node 4). A current source 234 (I[4]) connects between node 204 (node 4) and a ground reference point 214. Another current source 236 (I[6]) connects between node 206 (node 6) and a ground reference point 216.

For the RC-tree network of FIG. 2, branch currents are first calculated in a first "tree walk" or pass through the network from the ends of the tree backwards towards the driving node (node 0). This is a "bottom-up" walk as described hereinabove. (The notation I(x,y) means the current flowing from node "x" to node "y", where x and y are the single digit node numbers specified hereinabove with respect to FIG. 2:

I(5,6)=I[6]
I(2,5)=I[5]+I(5,6)
I(3,4)=I[4]
I(2,3)=I[3]+I(2,5)
I(0,1)=I[1]+I(1,2)

The node voltages (which may then be used to calculate the moments according to eq. (19)) are calculated next in a second tree walk. This time the tree is traversed outward from the driving point towards the ends of the tree in a "top-down" fashion, as described hereinabove:

v(1)=0−I(0,1)*R(0,1)
v(2)=v1−I(1,2)*R(1,2)
v(3)=v2−I(2,3)*R(2,3)
v(4)=v3−I(3,4)*R(3,4)
v(5)=v2−I(2,5)*R(2,5)
v(6)=v5−I(5,6)*R(5,6)

Pole Calculation

Once the moments $m_{-1}, m_0, m_1, \ldots$ have been calculated from the node voltages and currents, the characteristic equation for the poles can be determined.

The characteristic equation has the form:

$$a_0 + a_1 x^{-1} + \ldots + a_{q-1} x^{-q+1} + x^{-q} = 0 \quad (21)$$

where "x" is an arbitrary variable and $a_0, a_1, a_2 \ldots$ are constants. The poles ($p_1, p_2, p_3, \ldots$) of the network are the "q" roots of this qth-order characteristic equation. (The pole subscripts are arbitrary numbers not associated with any iteration).

Since the following equation applies, $$-\left( \frac{k_1}{p_1^j} + \frac{k_2}{p_2^j} + \ldots + \frac{k_q}{p_q^j} \right) = m_{j-1} \quad (22)$$

for $j = 0, 1, \ldots$ it follows that:

$$-\left( \sum_{j=0}^{q-1} a_j \frac{k_1}{p_1^{j+s}} + \sum_{j=0}^{q-1} a_j \frac{k_2}{p_2^{j+s}} + \ldots + \sum_{j=0}^{q-1} a_j \frac{k_q}{p_q^{j+s}} \right) = \sum_{j=0}^{q-1} a_j m_{j+s-1} \quad (23)$$

But the following is true because $p_1$ satisfies the characteristic equation.

$$\sum_{j=0}^{q-1} \frac{a_j}{p_1^{j+s}} = -\frac{1}{p_1^{q+s}} \quad (24)$$

Substituting:

$$-\left( -\frac{k_1}{p_1^{q+s}} - \frac{k_2}{p_2^{q+s}} - \ldots - \frac{k_q}{p_q^{q+s}} \right) = \sum_{j=0}^{q-1} a_j m_{j+s-1} \quad (25)$$

and $$-\left( \frac{k_1}{p_1^{q+s}} + \frac{k_2}{p_2^{q+s}} + \ldots + \frac{k_q}{p_q^{q+s}} \right) = m_{q+s-1} \quad (26)$$

Combining equations (25) and (26):

$$-\sum_{j=0}^{q-1} a_j m_{j+s-1} = m_{q+s-1} \quad (27)$$

for $s = 0, 1, 2, \ldots$

Equation (27) may also be expressed in an (infinite) matrix form:

$$\begin{bmatrix} m_{-1} & m_0 & \ldots & m_{q-2} \\ m_0 & m_1 & \ldots & m_{q-1} \\ m_1 & m_2 & \ldots & m_q \\ m_3 & m_3 & \ldots & m_{q+1} \\ \ldots & \ldots & \ldots & \ldots \\ m_{s-1} & m_s & \ldots & m_{s+q-1} \\ \ldots & \ldots & \ldots & \ldots \end{bmatrix} \begin{bmatrix} -a_0 \\ -a_1 \\ -a_2 \\ \cdot \\ \cdot \\ \cdot \\ -a_{q-1} \end{bmatrix} = \begin{bmatrix} m_{q-1} \\ m_q \\ m_{q+1} \\ \cdot \\ \cdot \\ m_{q+s\pm 1} \\ \cdot \end{bmatrix} \quad (28)$$

Since there are only "q" unknowns, the infinite matrix can be reduced to a q×q square matrix to solve for a. The easiest way is to use the first "q" rows of the matrix. This is the method used by AWE. After solving for the "$a_x$" coefficients, the characteristic equation can be used to find all "q" poles.

The method also works for multiple poles. Assuming that $p_1$ is a r-multiple pole, that is: $p_1 = p_2 = p_3 = \ldots = p_r$ and $p_1 \neq p_{r+1}$:

$$X(s) = \frac{k_1}{s - p_1} + \frac{k_2}{(s - p_1)^2} + \ldots + \frac{k_r}{(s - p_1)^r} + \quad (29)$$

$$\frac{k_{r+1}}{s - p_{r+1}} + \ldots + \frac{k_q}{s - p_q}$$

and $$X^{(j)}(s) = \frac{(-1)^j j! k_1}{(s - p_1)^{j+1}} + \ldots \quad (30)$$

Residue Calculation

After the poles have been calculated, equation (13) can be used to calculate residues, provided that all poles are single poles. It is only necessary to solve the following linear system:

$$\begin{bmatrix} -\frac{1}{p_1^s} & -\frac{1}{p_2^s} & \ldots & -\frac{1}{p_q^s} \\ -\frac{1}{p_1^{s+1}} & -\frac{1}{p_2^{s+1}} & \ldots & -\frac{1}{p_q^{s+1}} \\ \ldots & \ldots & \ldots & \ldots \\ -\frac{1}{p_1^{s+q-1}} & -\frac{1}{p_s^{s+q-1}} & \ldots & -\frac{1}{p_q^{s+q-1}} \end{bmatrix} \begin{bmatrix} k_1 \\ k_2 \\ \cdot \\ \cdot \\ k_{q-1} \\ k_q \end{bmatrix} = \begin{bmatrix} m_{s-1} \\ m_s \\ m_{s+1} \\ \cdot \\ \cdot \\ m_{s+q-2} \end{bmatrix} \quad (31)$$

Any set of q moments (e.g., $m_{s-1}, m_s, \ldots, m_{s+q-2}$) can be used to calculate $k_1, k_2, \ldots, k_q$. The simplest way is to let s=0.

If a pole is not simple (i.e., a multiple pole), then the above linear system will be singular. But it is still possible to solve for k. Assuming p is an r-pole, then the solution for the state equation corresponding to p is given by:

$$k_1 e^{pt} + k_2 t e^{pt} + k_3 t^2 e^{pt} + \ldots + k_r t^{r-1} e^{pt} \quad (32)$$

And its Laplace transform is:

$$\frac{k_1}{s - p} + \frac{k_2}{(s - p)^2} + \ldots + \frac{k_r}{(s - p)^r} \quad (33)$$

RC-mesh Network Simplification

Since the interconnect portion of a post-layout net (i.e., a net on a semiconductor design automation system resulting from an integrated circuit layout process) is in the form of a generalized RC-mesh network, which can contain loops, it is necessary to transform the net in some way so that it is suited to analysis by methods such as the AWE method. This is accomplished by a new moment calculation method based on a specialized sparse matrix decomposition technique called "Network Collapsing," (replacing the moment calculation scheme in prior-art methods such as AWE), useful for any RC-mesh type of circuit.

As stated hereinabove, prior-art methods such as the AWE method are not suited to general RC-mesh calculations in their existing form. However, the computational approach taken by the AWE method is very attractive for its ability to handle large networks with relatively little computation time required. Since delay determination for typical integrated circuit nets involve the solution of general RC-mesh problems, in order to use the AWE method to determine net delays it is necessary to find a method to convert the RC-mesh representation of the net to a form which is more readily operated upon by the AWE method.

One of the key considerations in applying AWE-like approaches to the simulation of RC-mesh networks is finding an efficient way to compute moments for the network. This is accomplished by converting the network into an equivalent DC network. The present inventive technique is based on the idea that the circuit may be simplified by collapsing superbranches (SB's and GSB's), followed by collapsing superpaths (SP's). Then a general nodal matrix method is used to solve the simplified DC network. For most chip-level layout nets (e.g., clock distribution nets, etc.), there will be only a relatively few nodes remaining after simplifying the network (collapsing). This implies that the nodal matrices will be relatively small. For 95% of the nets on a typical integrated circuit design, the net (network) can be simplified by performing only superbranch collapsing (i.e., RC-tree).

In the following discussion with respect to "collapsing" nets, primes (i.e., apostrophes in notation, e.g., "i'" read as "i prime") are used to refer to "effective" quantities at a node resulting from the elimination (reduction or collapse to a circuit equivalent) of one or more nodes. For example, i'[a] refers to an "effective" ground current at node "a" determined as a result of a node elimination. This notation is applies only to discussions with respect to the present inventive technique and does not apply to the discussion of AWE (AWE does not "collapse" nodes).

In summary, the following notations, including the notations previously described, will be adhered to hereinafter in discussions with respect to "nets":

| Notation | Meaning |
| --- | --- |
| i[a] | ground current at node "a" |
| i'[a] | effective ground current at node "a" |
| i'(b,a) | effective ground current contribution to node "a" resulting from the collapse of node "b" |
| R(a,b) | series resistance between nodes "a" and "b" |
| R'(a,b) | effective series resistance between nodes "a" and "b" |
| r[a] | ground resistance at node "a" |
| r'[a] | effective ground resistance at node "a" |
| r'(b,a) | effective ground resistance contribution to node "a" resulting from the collapse of node "b" |

Network Collapsing

The present invention is directed to reducing (collapsing) generalized RC-mesh networks, such as those encountered in many semiconductor design automation systems, to a form suitable for analysis by network analysis techniques, such as the AWE method. The present inventive technique is characterized by a series of steps resulting in the computation of moments for an RC-mesh network. In order to compute these moments, it is necessary to reduce portions of the network by "eliminating" nodes so that the network may be more readily analyzed. After having analyzed the reduced network (for voltages, currents, etc.), it is possible to re-expand the network, using the resultant information from the analysis, to extend the analysis to the "eliminated" nodes. The steps involved in reducing the network include:

"Superbranch" (SB) Collapsing

"Generalized Superbranch" (GSB) Collapsing

"Superpath" (SP) Collapsing

FIGS. 3a–3e are node connectivity graphs of a network in various stages of collapse (reduction) using the present inventive technique. Each node (junction) of the network is connected to at least one other node by a line. These node connectivity "graphs" represent interconnections between points on an integrated circuit, and it is generally assumed that driving nodes may be represented as grounded resistances (which correspond to driving-point impedances), that each node has a (ground-referenced) capacitance represented by a current source to ground (corresponding to FET junction gate capacitances and/or other parasitic capacitances), and that there is a series resistance along each "line" between nodes (corresponding to the resistance of the metal wiring itself). In keeping with the aforementioned notational standard for this specification, R(x,y) refers to a resistance between node n"x" and n"y", i[x] is a current source connected from node "x" to ground, etc.

Figure 3A:
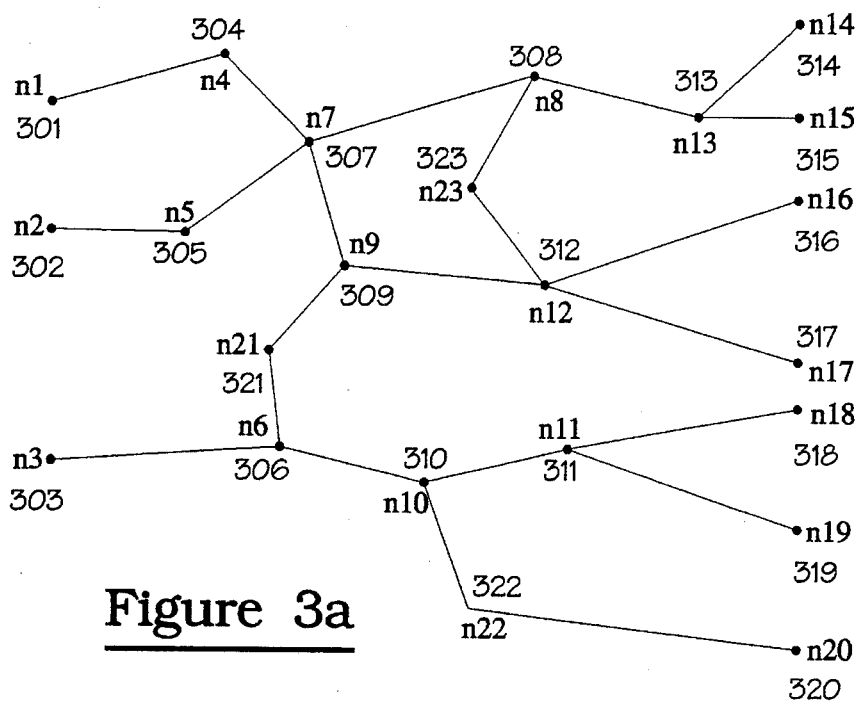
FIGS. 3a–3e are node connectivity graphs representing a net at various stages in a collapse process.
Figure 3B:
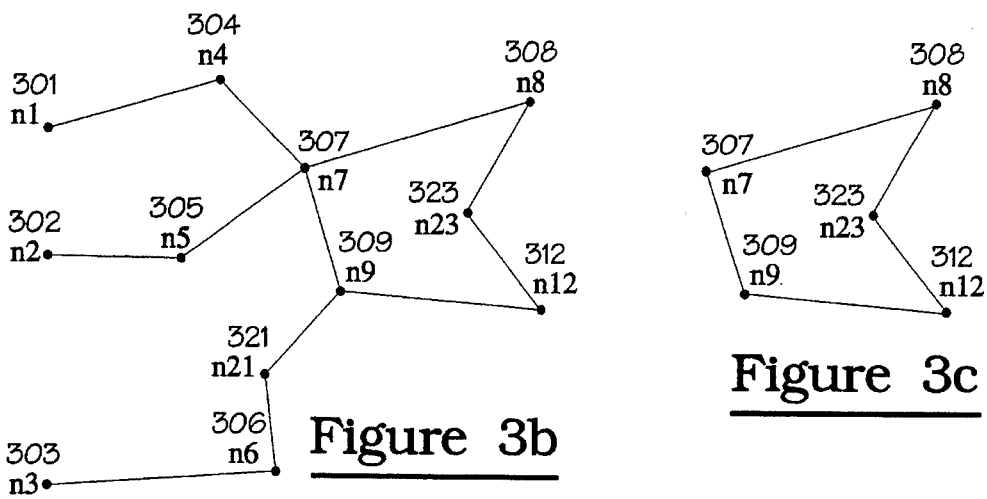
Figure 3C:
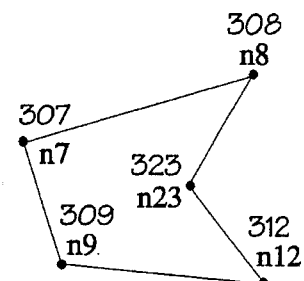
Figure 3D:
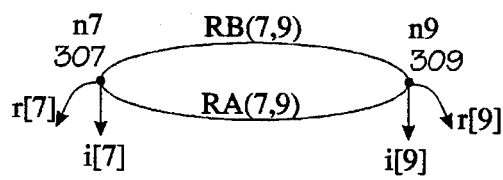
Figure 3E:
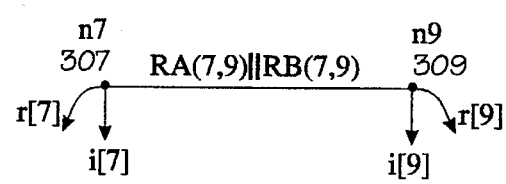

FIGS. 3a–3e are used to illustrate the "topology" of network collapsing. The detailed mathematical basis for this collapse is discussed hereinbelow with respect to FIGS. 4'x'–7'x'. FIG. 3a shows an un-reduced network in its original form. FIG. 3b shows the network after collapsing (eliminating or reducing) "superbranches" or SB's. FIG. 3c shows the network after collapsing "generalized superbranches" of GSB's. FIG. 3d shows the network after collapsing superpaths, showing the reduction of two series paths around a loop to two resistances in parallel. FIG. 3e shows a final reduction of the two resistances to a single equivalent resistance, completing the collapse (reduction) of the network to a very simple form suitable for analysis by the AWE method.

FIG. 3a is a node map of a representative un-reduced network (net) having three separate driving nodes n1, n2, and n3 (301, 302, and 303, respectively). Six nodes n14, n15, n16, n17, n18, n19, and n20 (314, 315, 316, 317, 318, 319, and 320, respectively) are all driven. There is a loop formed by connections between nodes n7, n8, n23, n12, and n9 (307, 308, 323, 312, and 309, respectively), whereby node n7 (307) connects to node n8 (308), which in turn connects to node n23 (323), which in turn connects to node n12 (312), which in turn connects to node n9 (309). (Each node in the node map is connected to at least one other node by a line indicating a connection). It is assumed that there is a series resistance between nodes (i.e., along the lines) and a ground current from each node. Each driving point, i.e., n1 (301), n2 (302), and n3 (303), is assumed to have a source resistance, which is effectively a grounded resistance, resulting in the classification of the network branches containing them as "Generalized Superbranches" or "GSB's", rather than "Superbranches" or "SB's".

The topology of the network depicted in FIG. 3a is such that driving node n1 (301) connects to node n4 (304), which in turn connects to node n7 (307), which is a part of the aforementioned loop. Driving node n2 (302) connects to node n5 (305), which further connects to node n7 (307). Driving node n3 (303) connects to node n6 (306) which further connects to node n21 (321), which still further connects to node n9 (309), which is part of the aforementioned loop. Further, a subtree is formed off of node n6 (306) by way of connections starting with a connection from node n6 (306) to node n10 (310). Node n10 (310) then connects (separately) to nodes n11 (311) and n22 (322). Node n11 (311) further connects (separately) to driven nodes n18 (318) and n19 (319). Node n22 (322) further connects to driven node n20 (320). Driven nodes n16 (316) and n17 (317) each connect to node n12 (312) which is a part of the aforementioned loop. Nodes n14 (314) and n15 (315) each connect to a node n13 (313) which in turn connects to node n8 (308), which is a part of the aforementioned loop.

The connectivity data for the node connectivity graph of FIG. 3a is tabulated in Table 1. Each "row" of Table 1 gives the connectivity data for one node. Reading from left to right, the first column ("node") contains the "current" node for which the connectivity data is provided. The second column ("# conn.") indicates the number of other nodes to which the "current" node is connected. Nodes which are connected to only one other node are "endpoint nodes," as defined hereinabove. If a node is annotated with "1(d)" in the second column of Table 1, it is a driven endpoint node or "driving node." If node is annotated with "1(leaf)" in the second column of table 1, then it is a non-driven endpoint node or a "receiving node." Columns 3–6 ("conn. 'x'") indicate which node(s) the "current" node is connected to.

As stated hereinabove, the network collapse is accomplished by applying, in sequence, superbranch elimination, generalized superbranch elimination, and superpath elimination. Prior to performing these steps, however, it is necessary to scan the connectivity data for the net to identify the superbranches, generalized superbranches, and superpaths to be eliminated (collapsed).

Superbranches may be identified by scanning the connectivity data (Table 1) for the net, starting from each "internal node" of the net. An "internal node" is one which has a number of connections (degree of connectivity) of two or higher. According to Table 1, then, the candidate internal nodes are n4, n5, n6, n7, n8, n9, n10, n11, n12, n13, n21, n22, and n23. A branch is traced outward (i.e., not re-tracing the trace path) from each internal node, verifying that along that branch, no node number is visited twice, and no grounded resistances are encountered at any node. (The trace will end at endpoint nodes, where no further trace is possible) If either condition is not met, another branch originating at that node is tried. If all conditions are met, then the "branch" connectivity data is recorded as a "superbranch." The origin node (node from which the superbranch was traced) is the "root" node of the superbranch, and all nodes of the superbranch other than the root node are collapsed and eliminated using a technique described hereinbelow with respect to FIGS. 4a–4b. If a superbranch contains a root node of a previously determined superbranch, then the connectivity data for the previous superbranch is subsumed by the present superbranch, i.e., the connectivity data for the previous superbranch is incorporated into the "current" superbranch, after which the previous superbranch data is discarded.

As an example, tracing from node n8, the following trace data would be encountered (an underlined node is a "fork" node for which more than one path must be traced):

first attempt:

n8–
  n7–
    n4–n1   (grounded resistance, not a SB)

second attempt:

n8–
  n13–
    n14(leaf)
    n15(leaf)   (successful scan, SB found)

third attempt:

n8–n23–
  n12–
    n9–
      n7–n4–n1   (grounded resistance, not a SB)

Table 2 represents the superbranch connectivity data discovered in the scan of the net of FIG. 3a for superbranches. Four superbranches were found. In the example branch trace from node 8, a superbranch was found in the second trace attempt. This particular superbranch is listed as SB1 in Table 2. In the first and third trace attempts, a grounded resistance was encountered (at node 1 and node 3, respectively), thereby disqualifying that branch trace as a superbranch.

Table 2 lists connectivity data for the superbranches discovered. Left to right, the columns indicate 1) the superbranch (SB) number, 2) the member nodes of the superbranch, 3) the number of connections to each node of the superbranch (The path is traced away from the root only. The "root" has 1 connection, "leaf" nodes have 0.), and 4–5) the "next" node(s) in the superbranch.

After identifying the superbranches (SB's). the superbranches are eliminated by collapsing each to a single equivalent root node. There a 4 SB's: (n8,n13,n14,n15, which will be collapsed to SB root node n8 (308)), (n12,n16, which will be collapsed to SB root node n12 (312)), (n12, n17, which will also be collapsed to SB root node n12), and (n6,n10,n11,n18,n19,n22,n20, which will be collapsed to SB root node n6 (306)). As each node is eliminated in a SB, resistances and currents in an adjacent node are adjusted to compensate and to provide an equivalent circuit from the point of view of the root node. The details of this process are discussed in detail hereinbelow. After the SB has been completely collapsed, the root node contains compensating current and resistance values.

FIG. 3b is a node connectivity graph of the network of FIG. 3a after eliminating superbranches, as described above. This leaves a simplified network which does not include any SB's.

Table 3 contains the node connectivity data for the node connectivity graph of FIG. 3b. The data organization in the table is the same as for Table 1.

Generalized superbranches are now identified. This is accomplished by scanning the node connectivity data for the reduced network (see FIG. 3b and Table 3) in exactly the same manner as un-reduced node connectivity data (FIG. 3a and Table 1) was scanned for superbranches, except that during this scan, grounded resistances are allowed.

Performing a similar example branch trace (scan) from node n8 according to the reduced node connectivity graph of FIG. 3b and the corresponding reduced node connectivity data of Table 3 yields the following:

first attempt:

n8–
  n7–
    n4–n1   (endpoint node, continue trace)
    n5–n2   (endpoint node, continue trace)
    n9–n12–n23–n8   (loop, not a GSB)

second attempt:

n8–
  n23–n12–
    n9–
      n7–
        n4–n1   (endpoint node, contiune trace)
        n5–n2   (endpoint node, continue trace)
        n8   (loop, not a GSB)

Neither of the two possible scans originating at node n8 produces a "legal" generalized superbranch (GSB). However when a scan (branch trace) is performed relative to node n7, the following data results:

First attempt:

n7–
  n4–n1   (end of branch, GSB found)

Second Attempt:

n7–
  n5–n2   (end of branch, GSB found)

Third attempt:

n7–
  n8–n23–n12–n9–n7   (loop, not A GSB)

The scan (branch trace) with respect to node 7 yields two generalized superbranches, on the first and second attempts, respectively. These GSB's and the results of the remainder of the GSB scan are tabulated in Table 4. The data organization of Table 4 is identical to that of Table 2.

It is next necessary to eliminate (collapse) all of the Generalized Superbranches (or GSB's) identified, i.e., (n9, n21,n6,n3), (n7,n4,n1), and (n7,n5,n2). The result of eliminating "GSB's" is similar to that of eliminating "SB's". In either case, each "branch" (SB or GSB) of the network is collapsed to its root node, providing an electrical equivalent to the remainder of the network. After eliminating all GSB's, the network topology reduces to that shown in FIG. 3c, including only nodes n7 (307), n8 (308), n23 (323), n12 (312), and n9 (309). Of the remaining 5 nodes, only two nodes have grounded resistances (the driving point resistances of nodes n1–3 are reflected in their "collapsed" form). They are nodes n7 (307) and n9 (309).

FIG. 3c is a node connectivity graph of the net after GSB collapse. The connectivity data for FIG. 3c is contained in Table 5.

The third and final step in collapsing the network is "Superpath Collapsing" whereby "superpaths" or SP's are eliminated (reduced). In the node map of FIG. 3c, a simplified network remains, reflecting the results of SB and GSB collapse applied to the network reflected in the node map of FIG. 3a. The are two SP's in the Figure, i.e. (n7, n8, n23, n12, n9) and (n7, n9). Once circuit equivalents have been determined and the "eliminated" nodes have been removed (by a process described in detail hereinbelow), a very simple network with only two nodes (n7 and n9) remains.

Table 6 contains the data resulting from superpath identification. Since all nodes in a superpath are of degree 2 in connectivity (i.e., they are internal nodes which do not "fork"), the columnar format of Table 6 is reduced relative to that of Tables 2 and 4.

FIG. 3d shows the resultant node connectivity graph after superpath collapse. FIG. 3d is additionally annotated to show the resistance and current values associated with the reduced network. Specifically, a grounded resistance r[7] and grounded current i[7] occur at node n7 (307) and a grounded resistance r[9] and grounded current i[9] occur at node n9 (309). A first resistance RA(7,9) between nodes n7 (307) and n9 (309) occurs as a result of the collapse of the first SP (i.e., n7, n8, n23, n12, n9), while a second resistance RB(7,9) in parallel with the first resistance occurs between nodes n7 and n9 as a result of the collapse of the second SP (i.e., n7, n9).

Since the two resistances may be reduced to an equivalent parallel combination (RA∥RB), as shown with respect to FIG. 3e, the loop originally comprising nodes n7, n8, n23, n12, and n9 is reduced to the simple network as shown. This equivalent network is in a form which may be used in combination with any suitable network analysis technique, such as AWE, to determine the waveforms at nodes n7 and n9.

Superbranch Collapsing

Superbranches are "subtrees" of the network extending outward from a single node. A superbranch subtree is characterized by one or more "forked" node-to-node paths which do not re-join at any point and which have no grounded resistances at any of the sub-nodes. The whole subtree can be collapsed to an equivalent circuit at the root node. The root node of the subtree will have an increase in current. The increased amount is equal to the sum of all current sources in the subtree. This is illustrated with respect to FIGS. 4a and 4b.

Figure 4A:
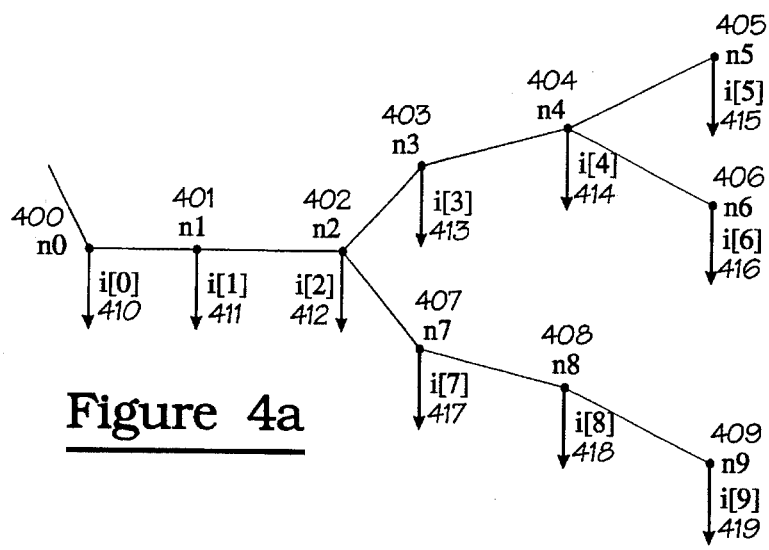
FIG. 4a is a node connectivity graph of a representative superbranch network.

FIG. 4a is a node connectivity graph showing a representative superbranch having 10 nodes (n0–n9, 400–409, respectively). The superbranch originates at a root node n0 (400). Each node n0–n9 has a corresponding ground current (i[0]–i[9], 510–519, respectively). Each node is connected to at least one other node by a line (It is assumed that there is a known series resistance R(x,y) associated with each line between two nodes n"x" and n"y"). Node n0 (400) connects to node n1 (401). Node n1 (401) connects to node n2 (402). Node n2 (402) connects to nodes n3 (403) and n7 (407). Node n3 (403) connects to node n4 (404) which in turn connects to nodes n5 (405) and n6 (406) which are "driven" nodes at the end of the superbranch. Node n7 (407) connect to node n8 (408), which in turn connects to node n9 (409). Node n9 (409) is also a "driven" node at the end of the superbranch. A superbranch is collapsed by summing all of the node ground currents in the superbranch and applying them to the root node, then eliminating all nodes but the root node. Since there are no grounded resistances anywhere in a superbranch, the resultant single collapsed node with an adjusted ground current behaves exactly as it does in the un-reduced superbranch network.

Figure 4B:
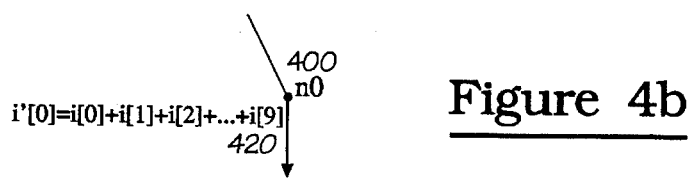

FIG. 4b is a node connectivity graph of the superbranch of FIG. 4a after collapse (reduction). The superbranch is collapse to its "root" node, n0 (400). The ground current at node n0 (400) (the root node of the superbranch) is set to an adjusted current i'[0] 420 equal to the sum of all of the node currents in the superbranch, i.e., i0+i1+i2+i3+ . . . +i9. All nodes other than the root node n0 400 are eliminated, leaving a single node with a ground current as an equivalent for the superbranch. Since there are no ground resistances in a superbranch (by definition), all of the currents must be drawn down through the superbranch, and ultimately through the root node. Therefore, the root node has an effective ground current drawn from it equal to the sum of all of the ground currents in the superbranch.

For the following discussion with respect to FIGS. 4a and 4b, the relationship between two adjacent connected nodes is defined such that the node closest (path-wise) to the "root" node of the superbranch is called the "parent" node, while the node further from the "root" node is called the "child" node. A "parent" node may have more than one "child" node, but a "child" node can have only one "parent" node. This is dictated by the definition and topology of a superbranch.

Table 7 tabulates connectivity data, series resistances, ground currents (i[x]), and effective ground currents (i'[x]) for all nodes of the superbranch. The connectivity data in the "parent" and "child(ren)" columns of the table results from superbranch identification in the manner discussed hereinabove with respect to FIG. 3a and Tables 1 and 2. The series resistances between nodes and the ground currents are known (pre-calculated) values resulting from the integrated circuit design and layout processes (at least for the purposes of delay calculation).

The effective ground currents are determined by starting adding the equivalent ground currents of every node in the superbranch to the actual ground current of its parent. The resultant sum at the parent node is the effective ground current. If this process is performed in a sequential, hierarchical fashion starting at the leaf nodes and progressing towards the root, the values are readily determined. The effective current values for the superbranch sub-network of FIG. 4a are tabulated in the rightmost column of Table 7. This effective current relationship between parent and child nodes may be summarized in the following equations which may be applied in a recursive procedure:

$$i'(\text{parent}) = i[\text{parent}] + \sum_{\text{child nodes}} i'(\text{child}) \tag{34}$$

$$i'[\text{leaf node}] = i[\text{leaf node}] \tag{35}$$

The effective ground currents in Table 7 are expressed in recursive fashion. Their fully resolved forms are as follows:

$i'[0] = i[0] + i[1] + i[2] + i[3] + i[4] +$
$i[5] + i[6] + i[7] + i[8] + i[9]$
$= i[0] + i'[1]$ $i'[1] = i[1] + i[2] + i[3] + i[4] + i[5] +$
$i[6] + i[7] + i[8] + i[9]$
$= i[1] + i'[2]$ $i'[2] = i[2] + i[3] + i[4] + i[5] + i[6] +$
$i[7] + i[8] + i[9]$
$= i[2] + i'[3] + i'[7]$ $i'[3] = i[3] + i[4] + i[5] + i[6]$
$= i[3] + i'[4]$ $i'[4] = i[4] + i[5] + i[6]$
$= i[4] + i'[5] + i'[6]$ $i'[5] = i[5]$ (leaf node)

$i'[6] = i[6]$ (leaf node)

$i'[7] = i[7] + i[8] + i[9]$
$= i[7] + i'[8]$ $i'[8] = i[8] + i[9]$
$= i[8] + i'[9]$ $i'[9] = i[9]$ (leaf node)

After a node voltage waveform is computed for node n0 (400) (by finishing the collapse of the network and applying a circuit analysis technique such as AWE to the reduced network), node voltages and waveforms for the other nodes in the superbranch may be computed by re-expanding the superbranch, one node at a time, and applying the known effective node currents to the series resistances to determine a voltage drop relative to the root node, according to the following equation:

$$v_x[\text{child}] = v_x[\text{parent}] - i_x[\text{child}]R(\text{parent},\text{child}) \quad (36)$$

For example, to determine the voltage $v_x[1]$ at node n1 (401), we re-expand the network out to node n1 (401) such that the network consists of the root node n0 (400), the root node ground current i[0] (410) a known series resistance R(0,1) to node n1, and an effective ground current at node n1 ($i'[1]$), previously calculated and tabulated above. This current is applied to the series resistance R(0,1) to determine the voltage drop across the series resistance from node n0 (400) to node n1 (401). The node voltage at node n0 (400) (i.e., $v_x[0]$) is reduced by this value (the voltage drop) to determine the node voltage $v_x[1]$ at node n1 (401). Similarly, the node voltages at the remaining nodes may be calculated in the same way: expanding the network one node at a time, applying the total effective ground current from unexpanded nodes along the path of the newly expanded node to the series resistance between the previously expanded node along the path and the newly expanded node to determine a voltage drop, then reducing the node voltage from the previously expanded node by the amount of the voltage drop to determine the node voltage at the newly expanded node. Essentially, the network collapse is "played back" in reverse to determine the node voltages at the collapsed nodes.

Generalized Superbranch Collapsing

The topology (connectivity and layout) of Generalized Superbranches, or GSB's, is identical to that of superbranches. The only difference between the two is that any node of a GSB can have a grounded resistance. The grounded resistances, however, complicate the analysis, preventing the use of the simpler collapse technique described hereinabove with respect to FIGS. 4a and 4b.

Figure 5A:
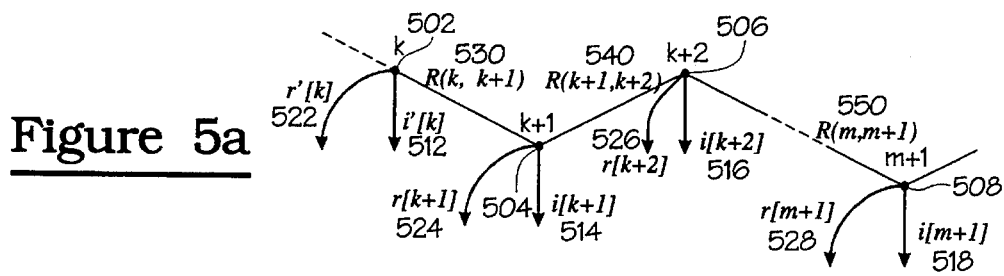
FIGS. 5a–5c are node connectivity graphs of a representative generalized superbranch network at various stages in a collapse process.

FIG. 5a is a node connectivity graph of a representative portion of a Generalized Superbranch, or GSB. Since the general case is to be considered, node "letters" (e.g., k, k+1, m, m+1) are used rather than node numbers to designate nodes. The GSB depicted in FIG. 5a comprises a series of serially connected nodes k (502), k+1 (504), k+2 (506), and a root node m+1 (508). A dashed connection line between nodes k+2 (506) and root node m+1 (508) indicates the possible presence of other nodes therebetween, not being considered in the following discussion. Each node has a respective ground current, (i.e., i'[k] 512, i[k+1] 514, i[k+2] 516, and i[m+1] 518, indicated as downward pointing arrows) and a respective grounded resistance (i.e., r'[k] 522, r[k+1] 524, r[k+2] 526, and r[m+1] 528, indicated as curved downward pointing arrows). A series resistance R(k,k+1) (530) extends between nodes k (502) and k+1 (504). A series resistance R(k+1,k+2) 540 extends between nodes k+1 (504) and k+2 (506). Another series resistance R(m,m+1) 550 extends between an unseen node m and node m+1 (508). These series resistances are indicated in the Figure as text annotations along the connections lines between nodes.

The object of collapsing a GSB is to begin at the endpoint nodes and work towards the root, collapsing each node along the way. FIG. 5a shows a GSB which has already been collapsed, in part. As shown, the GSB has been collapsed up to node k (502), as indicated by the presence of an "effective" ground resistance r'[k] (522) and "effective" ground current i'[k] (512). The next step in the process is to collapse node k (501) to node k+1 (504), thus eliminating node k and determining new "effective" ground resistance and current, r'[k+1] and i'[k+1], respectively, to replace the ground resistance r[k+1] (524) and ground current i[k+1] (514), respectively. This is accomplished as described hereinbelow with respect to FIG. 5b.

Figure 5B:
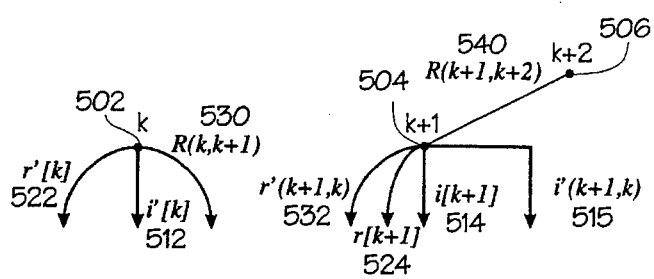

FIG. 5b is a node connectivity graph showing a first step in the collapse of the network. First, an effective grounded resistance r'(k+1,k) (532) (exclusive of the ground resistance r[k+1] (523) at node k+1 (504)) is determined by adding the value of the series resistance R(k,k+1) between node k (502) and k+1 (504) to the effective ground resistance r'[k] (512) at node k (502):

$$r'(k+1,k) = r'[k] + R(k,k+1) \quad (37)$$

Next, an effective additional ground current contribution i'(k+1,k) (515) to node k+1 (504) from node k (502) is calculated.

$$i'(k+1,k) = \frac{r'[k]}{r'[k] + R[k+1]} i'[k] \quad (38)$$

At this point, node k (502) is effectively isolated from node k+1 (504), as shown in FIG. 5b. However, node k+1 (504) has two grounded resistances, r'(k+1,k) (532) and r[k+1] (524), and two ground currents, i'(k+1,k) (515), and i[k+1] (514). These are combined into equivalent values as shown with respect to FIG. 5c, completing the collapse of node k (502) into node k+1 (504).

Figure 5C:
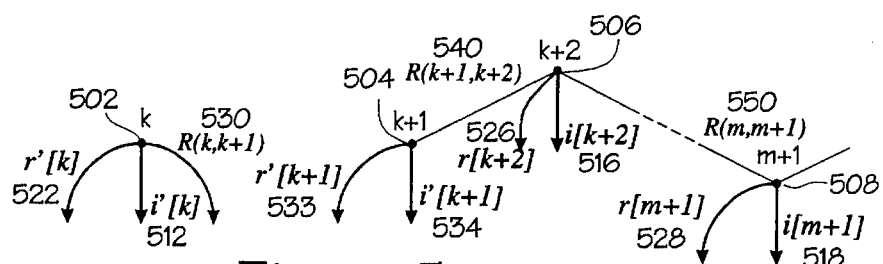

FIG. 5c is a node connectivity graph showing the final step in the simplification process whereby the two grounded resistances, r'(k+1,k) (532) and r[k+1] (524), and two ground currents, i'(k+1,k) (515), and i[k+1] (514), shown with respect to FIG. 5b, are combined into a single effective ground resistance r'[k+1] (533) and a single effective ground current i'[k+1] (534) according to the following equations.

$$r'[k+1] = \frac{1}{\frac{1}{r'(k+1,k)} + \frac{1}{r'[k+1]}} \quad (39)$$

$$= \frac{r'(k+1,k)r'[k+1]}{r'(k+1,k) + r'[k+1]}$$

$$i'[k+1] = i[k+1] + i'(k+1,k) \quad (40)$$

The process of collapsing the GSB proceeds in this manner until one node, the root node m+1 (508) remains. Upon completing the entire network collapse, the resultant simplified network is simulated, using an appropriate circuit simulation technique such as AWE, which will result, in part, in a node voltage for the root node m+1 (508) of the GSB. In order to determine the voltages at the remaining nodes, is calculated from the root outward. Assuming that the voltage at node k+1 v[k] is known, the following formula is used to calculate v[k]:

$$v[k] = v'[k] + \frac{r'[k]}{r'[k] + R(k,k+1)} v[k+1] \quad (41)$$

$$\text{where } v'[k] = \frac{-1}{\frac{1}{r'[k]} + \frac{1}{R(k,k+1)}} i'[k]$$

The GSB discussed hereinabove with respect to FIGS. 5a–c involved a simple series of serially interconnected nodes. A more complicated example is discussed hereinbelow with respect to FIGS. 6a–d.

FIG. 6a is a node connectivity graph of a Generalized Superbranch originating at a root node p+1 (610) and extending outward towards a node j+1 (608). Node j+1 (608) further connects to a node j (606), at which node the GSB "forks" outward to two nodes: node a (602) and node b (606). The GSB, as depicted in FIG. 6a has been collapsed along the two "fork" branches to node a (602) and node b (604), as indicated by effective ground resistances r'[a] (622) and r'[b] (624), respectively, and effective ground currents i'[a] (612) and i'[b] (614). Node j (606) has a ground resistance r[j] (626) and a ground current i[j] (616). Node j+1 (608) has a ground resistance r[j+1] (628) and a ground current i[j+1] (618). The root node p+1 (610) also has a ground resistance r[p+1] (630) and a ground current i[p+1] (620). A dashed line between nodes p+1 (610) and j+1 (608) indicate the possible presence of other unseen nodes therebetween, not relevant to the present discussion.

Series resistances exist between all connected nodes. These resistances are R(a,j) (632) between nodes a (602) and j (606), R(b,j) (634) between nodes b (604) and j (606), R(j,j+1) (636) between nodes j (606) and j+1 (608), and a series resistance R(p,p+1) (638), between the root node p+1 (610) and an unseen node p. All resistances are shown as annotations alongside connectivity lines on the node connectivity graph.

The next step in collapsing the GSB of FIG. 6a is to collapse nodes a (602) and b (604) into node j (606). Because this is a "fork" in the GSB involving the collapse of two nodes onto one, the process is slightly different than the process described hereinabove with respect to FIGS. 5a–c.

FIG. 6b is a node connectivity graph indicating the results of a first step of the collapse of the GSB of FIG. 6a. In this Figure, node b (604) is isolated (eliminated or collapsed) from node j (606). The collapse of a "fork" in a GSB is accomplished by separately collapsing each of the two "fork" nodes, in this case nodes a (602) and b (604), to their common parent node, in this case node j (606). Arbitrarily, node b is collapsed first, by determining an equivalent ground resistance r'(j,b) (627) from node j (606) along the path to node b (604), and an equivalent ground current contribution i'(j,b) (617) from node b (604) to node j (606) according to the following formulas:

$$r'(j,b) = r'[b] + R(j,b) \quad (42)$$

$$i'(j,b) = \frac{r'[b]}{r'(j,b)} i'[b] \quad (43)$$

The concept here is that the equivalent ground resistance r(j,b) (627) added in parallel to r[j] (626) as a result of node b's (604) contribution is the sum of node b's effective ground resistance r'[b] and the series resistance R(b,j) between node b (604) and node j (606), and that the ground current contribution i'[b] (614) from node b (604) to node j (606) will result in part from the new equivalent ground resistance r'(j,b) (627), with the remainder, i'(j,b) (627) going to node j (606) directly.

FIG. 6c is a node connectivity graph showing the next step in collapsing the GSB in which node a (602) is effectively isolated (collapsed or eliminated) from node j (606). This collapse, like the collapse of node b (604) described hereinabove with respect to FIG. 6b, adds an equivalent ground resistance r'(j,a) (633) and ground current i'(j,a), to node j (606) as a result of the contributions from node a (602). The mathematical basis is identical to that for the collapse of node b (604), except that the appropriate values from node a (602) are substituted, as shown in the following equations:

$$r'(j,a) = r'[a] + R(j,a) \quad (44)$$

$$i'(j,a) = \frac{r'[a]}{R'(j,a)} i'[a] \quad (45)$$

Finally, all of the intermediate values are collected into single terms, as depicted in FIG. 6d. FIG. 6d is a node connectivity showing an effective ground resistance r'[j] (625) replacing the parallel combination of r'(j,b) (627), r'(j,a) (633). and r[j] (626), and further showing an effective ground current i'[j] (615) replacing the combination of i'(j,b) (617), i'(j,a) (613). and i[j] (616). The mathematical basis for these is that the effective ground resistance r'[j] (625) is equal to the values of r'(j,b) (627), r'(j,a) (633). and r[j] (626) in parallel, and that the effective ground current i'[j] (615) is the sum of i'(j,b) (617), i'(j,a) (613). and i[j] (616), as set forth in the following equations:

$$\frac{1}{r'[j]} = \frac{1}{r'(j,a)} + \frac{1}{r'(j,b)} + \frac{1}{r[j]} \quad (46)$$

$$r'[j] = \frac{r'(j,a)r'(j,b) + r'(j,a)r[j] + r'(j,b)r[j]}{r'(j,a)r'(j,b)r[j])} \quad (47)$$

$$i'[j] = i'(j,a) + i'(j,b) + i[j]$$

For any "parent" node (e.g., node j) having more than one "child" nodes (e.g., node and node b), this can be stated in a general form as follows:

$$\frac{1}{r'[\text{parent}]} = \sum_{\text{child nodes}} \frac{1}{r'(\text{child})} \quad (48)$$

$$i'[\text{parent}] = i[\text{parent}] + \sum_{\text{child nodes}} i'(\text{parent,child}) \quad (49)$$

Once the complete process of collapsing the network is has been accomplished and a simulation (e.g., AWE) results in a known node voltage at the root node p+1 (610) of the GSB, the rest of the node voltages can be determined by re-expanding the GSB outward from the root node (610). This is described hereinbelow with respect to determining the node voltages at nodes a (602) and b (604). The process is identical to that described with respect to FIG. 5c, i.e., the fact that a branch is forked has no effect on individual node in the re-expansion of the GSB. The following equations give the node voltages at "child" nodes a and b, given a known node voltage at "parent" node j.

$$v[a] = v'[a] + \frac{r'[a]}{r'[a] + R(a,j)} v[j]$$

$$\text{where } v'[a] = \frac{-1}{\frac{1}{r'[a]} + \frac{1}{R(a,j)}} i'[a]$$

This may be expressed in the general case for re-expanding collapsed "child" nodes where the "parent" node voltage is known:

$$v[\text{child}] = v'[\text{child}] + \frac{r'[\text{child}]}{r'[\text{child}] + R(\text{child,parent})} v[\text{parent}] \quad (51)$$

$$\text{where } v'[\text{child}] = \frac{-1}{\frac{1}{r'[\text{child}]} + \frac{1}{R(\text{child,parent})}} i'[\text{child}]$$

Superpath Collapsing

The final step in collapsing a net (network) into a simplified form is Superpath (SP) collapsing. As defined hereinabove, a superpath is an interconnected sub-network of serially-connected nodes, where none of the nodes has a grounded resistance. The Superpath collapse process is described hereinbelow with respect to a representative Superpath and FIGS. 7a–c.

A superpath is collapsed beginning at one of its two endpoint nodes (arbitrarily selected, it doesn't matter which is chosen due to the topological symmetry of a superpath), and collapsing nodes, one at a time towards the other endpoint node. Series resistances are simply added as they are encountered, while ground currents must be distributed, one portion towards one endpoint node and another portion towards the other endpoint node.

Figure 7A:
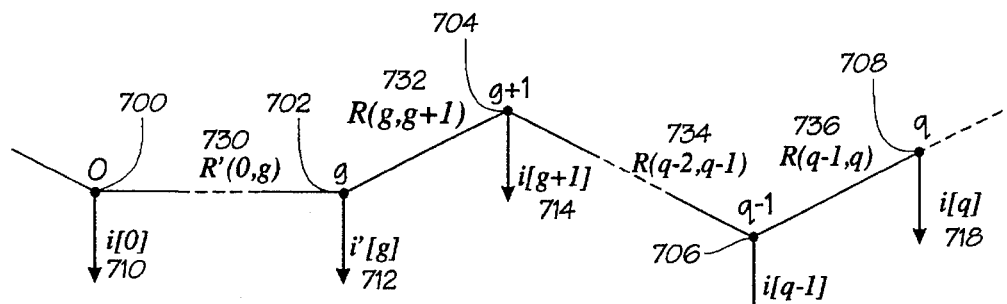
FIGS. 7a–7c are node connectivity graphs of a representative superpath network at various stages in a collapse process.
Figure 7B:
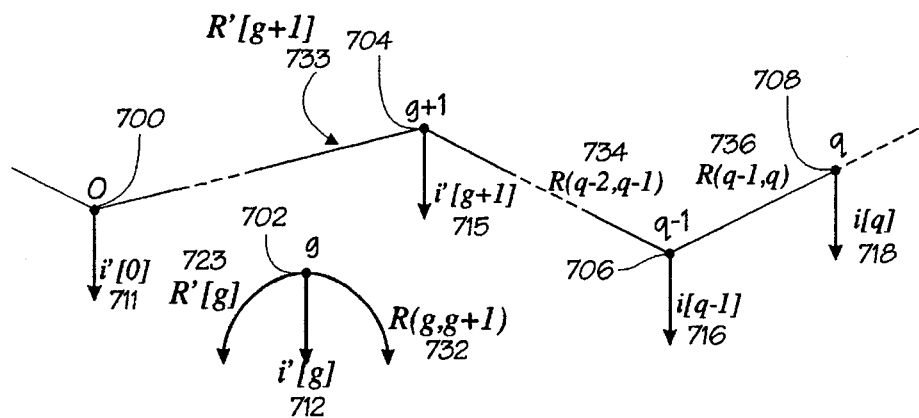

FIG. 7a is a node connectivity graph of a representative superpath starting at a first endpoint node "0" (700) and proceeding through serially connected nodes g (702) g+1 (704), some unseen nodes, node q–1 (706), finally ending at an second endpoint node q (708). As shown the superpath has been collapsed out to node g (704) as indicated by an effective ground current i'[g] (712) and an effective series resistance R'(0,g) between the origin node (700) and node g (702). Each node has a respective ground current, i.e., node 0 (700) has a ground current i[0], node g+1 (704) has a ground current i[g+1] (714), node q–1 (706) has a ground current i[q–1] (716) and node q (708) has a ground current i[q] (718). There are series resistances between connected nodes. Specifically, these are R(g,g+1) (732) between node g (702) and node g+1 (704), R(q–2,q–1) (734) between an unseen node q–2 and node q–1 (706) and R(q–1,1) (736) between node q–1 (706) and node q (708).

The next step in collapsing the superpath is to collapse node g (702) to the next node, g+1 (704). First, an effective series resistance between the origin node (700) and node g+1 (704) is computed.

$$\begin{aligned} R'(0,g+1) &= R'(0,g) + R(g,g+1) \\ &= R(0,1) + R(1,2) + \ldots + \\ &\quad R(q-1,q) + R(q,q+1) \end{aligned} \quad (52)$$

For the general case of determining an equivalent series resistance between a starting endpoint node (root) and an arbitrarily selected node of a superpath (x) after collapsing all nodes in between (i.e., root+1 to x–1), this may be expressed as:

$$\begin{aligned} R'(\text{root},x) &= R'(\text{root},x-1) + R(x-1,x) \\ &= \sum_{n=\text{root}}^{x-1} R(n,n+1) \end{aligned} \quad (53)$$

Next, the node current i[g] (712) from node g (702) must be divided between node 0 (700) and node g+1 (704). This is accomplished by distributing the current according to the resistances seen in each direction, as follows:

$$i'[0] = \frac{R(g,g+1)}{R'(0,g+1)} i'[g] + i[0] \quad (54)$$

$$i'[g+1] = \frac{R'(0,g)}{R'(0,g+1)} i'[g] + i[g+1] \quad (55)$$

Each time a node is collapsed, the effective ground current at the root node (700) is adjusted in this manner (i.e., according to equation (54), substituting the appropriate node values). The remaining nodes are collapsed in the same manner until the superpath is simplified to a network consisting of only the two endpoint nodes and an effective resistance between them. Both endpoint ground currents reflect the contributions of the eliminated nodes' ground currents.

Figure 7C:
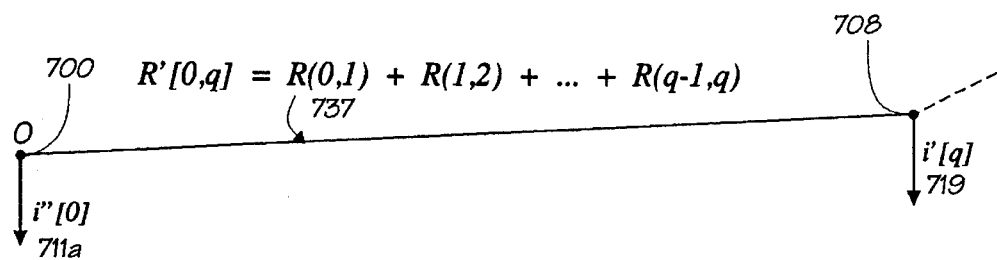

FIG. 7c is a node connectivity graph of the ultimate simplified superpath having only the two endpoint nodes, node 0 (700) and node q (708). The value of an effective series resistance R'(0,q) between the two endpoint nodes is the sum of the values of all of the series resistances between the nodes of the superpath. An adjusted effective ground current i"[0] (711a) is computed as described above, as is an effective ground current i'[q] (719) from node q.

Once the voltages at nodes 0 (700) and q (708) (the two endpoint nodes of the superpath) are known, the voltages for the collapsed nodes q–1, q–2, . . . , 1 can be recursively calculated. The following formula gives the voltage at node q–1 (i.e., the next node closer the starting endpoint node (root):

$$v[q-1] = v'[q-1] + \frac{R'(0,q-1)}{R'(0,q)} v[q] + \frac{R(q-1,q)}{R'(0,q)} v[0] \quad (56)$$

-continued $$\text{where } v'[q-1] = \frac{-1}{\frac{1}{R'(0,q-1)} + \frac{1}{R(q-1,q)}} \; i'[q-1] \quad (57)$$

This formula is applied iteratively, starting at the endpoint node of the superpath opposite the starting (root) endpoint node, (in this case starting at node q), and working backwards towards the starting endpoint node (in this case, node 0) to determine the voltages at all of the previously collapsed nodes.

Collapsing: Equivalent Circuit View

The foregoing discussion has been directed to the network topology and reduction methodology associated with collapsing a generalized RC-mesh network. While some attention has been given to the theoretical basis for these techniques, the ensuing discussion is more directed to an equivalent circuit view of how the method works with respect to superbranches and generalized superbranches.

Figure 8A:
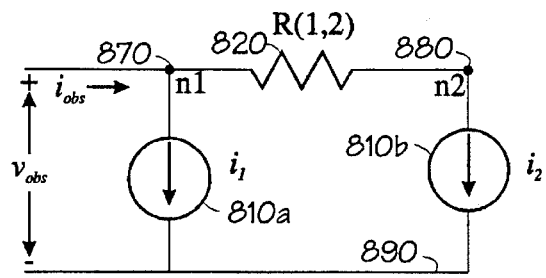
FIG. 8a is a schematic diagram of a circuit representing a portion of a superbranch network.

FIG. 8a is an example of a simple RC branch circuit, representative of a portion of a superbranch (SB), in that two nodes n1 (870) and n2 (880) have a series resistance R(1,2) (820) connected therebetween, and each has a ground current. Current i[1] (810a) connects from node n1 (870) to a ground reference (890). Current i[2] (810b) connects from node n2 (880) to the ground reference (890). The object is to create a simplified equivalent circuit from the point of view of an observer monitoring the voltage $v_{obs}$ at node n1 (870) and the current $i_{obs}$ entering node n1 (870).

From the point of view of the observer, both currents (i[1] and i[2], 810a and 810b, respectively) appear to be drawn directly from node n1. Since the impedance (resistance) of a current source is infinite, the resistor (820) has no effect. As a result, this circuit may be re-expressed as shown in FIG. 8b.

Figure 8B:
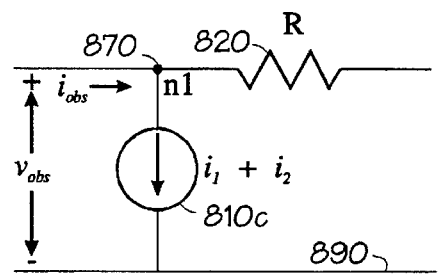

FIG. 8b is an equivalent circuit, from the point of view of an observer monitoring $v_{obs}$ and $i_{obs}$, for the circuit of FIG. 8a. To the observer, a ground current 810c equal to the sum of currents i[1] (810a) and i[2] (810b) is drawn from node n1. The resistance (820) has no impact on the equivalent circuit, but it does have an impact on the node voltage on the collapsed node, and will be used in calculating that node voltage upon re-expansion of the net.

In a superbranch, each leaf node appears to the "parent" of the leaf (next node closer to the root of the superbranch), exactly as node n2 appears to node n1 in FIG. 8a. When the leaf node is collapsed, the topology of the resultant network is such that the "parent" node now appears as a "leaf" node to the next node in the branch. As each node is collapsed, the process is simply repeated in the same fashion until the entire superbranch has been eliminated.

Figure 9A:
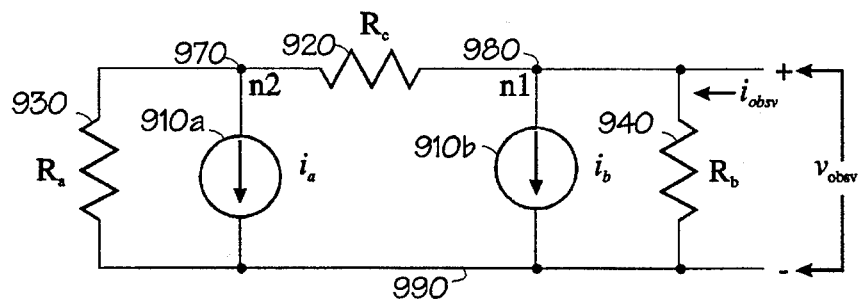
FIG. 9a is a schematic diagram of a circuit representing a portion of a generalized superbranch network.

Superbranches, such as the one discussed hereinabove with respect to FIGS. 8a and 8b, have no grounded resistances. Turning attention now to those cases where there are grounded resistances, (i.e., Generalized Superbranches), FIG. 9a is a schematic diagram of an equivalent circuit of two nodes of a superbranch, labeled node n1 (980) and node n2 (970). The observer's point of view is that of monitoring the voltage ($v_{obs}$) from node 1 (980) to a ground reference (990) and the current ($i_{obs}$) going into node 1 (980). The object is to collapse (eliminate) node n2 (970) without altering the observed voltage $v_{obs}$ or current $i_{obs}$.

Referring to FIG. 9a, a resistor $R_b$ (940) is connected between node n1 (980) and ground (990) and a ground current $i_b$ (910b) flows from node n1 (980) to ground (990). Similarly, a resistor $R_a$ (940) is connected from node n2 (970) to ground (990) and a ground current $i_a$ (910a) flows from node n2 (970) to ground (990). A series resistance $R_c$ (920) connects the two nodes n1 (980) and n2 (970). Since the impedance of a the two current sources (910a and 910b) is infinite, the equivalent resistance seen by the observer at node n1 (980) is equal to the parallel combination of $R_b$ (940) and the sum of $R_a$ (930) and $R_c$ (920). The current $i_a$ (910a) is distributed between $R_a$ (930) and $R_c$ (920), such that only a portion of the current $i_a$ (910a) is drawn from node n1. Standard engineering circuit analysis reveals that the equivalent current source across the equivalent resistance, as seen by an observer at node n1 (980) is given by:

$$i_{eqv} = \frac{R_a}{R_a + R_c} \; i_a + i_b$$

and the equivalent resistance is given by:

$$r_{eqv} = (R_a + R_c) \; R_b = \frac{R_b(R_a + R_c)}{R_a + R_b + R_c}$$

Figure 9B:
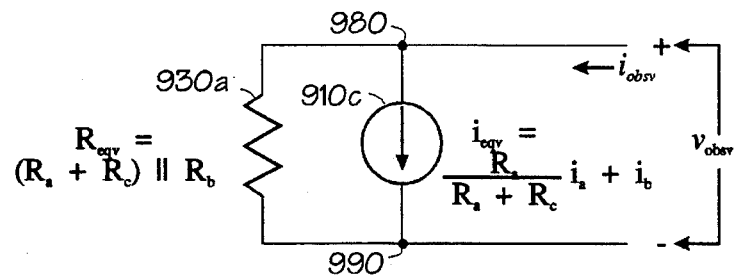

FIG. 9b is a schematic diagram of the resultant equivalent circuit. By substituting the equivalent circuit (FIG. 9b) for the actual circuit (FIG. 9a) the behavior of the circuit with respect to node n1 (980) can be considered apart from node n2 (970).

Network Collapsing: Procedural View

The process of collapsing an RC-mesh network may be summarized in procedural form as follows:
1. Collapse Superbranches
   1a. Scan the network and identify superbranches.
   1b. For each superbranch do:
      For each "child" node in the superbranch, add its grounded current to the grounded current of the root node. Then eliminate all of the "child" nodes.
2. Collapse Generalized Superbranches
   2a. Scan the network and identify generalized superbranches (GSB's)
   2b. For each GSB, do:
      for each node, working from the "leaf" nodes towards the "root" node, do:
         for each child node Ai (A1, A2, A3, . . . ) (closer to the "leaf" nodes) having a parent node B (closer to the root node) in the GSB do (note: for true "leaf" nodes, i'[A]=i[A] and r'[A]=r[A]):
         compute contributed effective ground resistance r'(B, Ai) from node Ai according to:
            r'(B,Ai)=r'[Ai]+R(Ai,B) where r[Ai] is the effective ground resistance at node Ai and R(Ai,B) is the resistance between nodes Ai and B.
         compute contributed effective ground current from Ai to B according to: i'(B,Ai)=i'[Ai]r'[Ai]/(r'[Ai]+R(B, Ai))
         calculate the total effective ground resistance for node B, by taking the parallel combination of all of the contributed effective ground resistances r'(B,Ai) and the ground resistance at node B (r[B]).
         calculate the total effective ground current i'[B] for node B by adding i[B] and all of the child node contributions i'[Ai].
         eliminate all of the child nodes.

3. Superpath collapsing
  3a. Scan the network and identify all superpaths.
  3b. For each superpath do:
  pick one of two endpoint nodes as starting node "S".
  for each node "A" along the path from the starting node "S" to the opposite branch node "E" having a next node "B" along the superpath, do:
    detach (eliminate) node A from the superpath. calculate the effective series resistance from node S to node B according to:
      R'(S,B)=R'(S,A)+R(B,A) where R'(S,A) is the effective series between node S and node A. (Note: the resistance when A=S is R(S,S)=0.) R(B,A) is the resistance between nodes A and B.
    calculate the distribution of the effective ground current i'[A] to nodes S and B according to (at first collapsed node, i'[A]=i[A], and initially, i'[S]=i[S]):
      i'[S]=(R(A,B)/R'(S,B))i'[A]+i'[S]
      i'[B]=(R'(0,A)/R'(0,B))i'[A]+i[B]

Network Simulation

After having simplified the network (net) as described in the procedure above, the simplified network is simulated on a linear system solver using a nodal matrix method (e.g., AWE) to determine voltages at the branch nodes of the simplified network (i.e., the nodes remaining after collapsing the network). Once these voltages are known, the network is re-expanded to determine the voltages at the collapsed nodes. Such methods are widely known in the art. The re-expansion process is expressed procedurally below (note: all effective values used in the re-expansion process are determined during the collapsed process and are known at the time of re-expansion):

Network Re-expansion 1. re-expand all Superpaths (SP's)
  for all SP's:
    for each collapsed node "B" the SP having a child node "A", starting at the collapsed node furthest from the starting node and working back to the starting node "S" (the child node "A" of the first collapsed node to be re-expanded is the endpoint node opposite "S", whose voltage is known from the nodal matrix solution):

$$v(A) = -1 * i'[A]/(1/R'(S,A) + 1/R(A,B)) +$$

$$R'(S,A) * v(B)/R'(S,B) +$$

$$R(A,B) * v(S)/R'(S,B)$$

where i[A] is the total current of node A,
  R(A) is the total resistance of node A,
  R(A,B) is the resistance between A and B
  v(B) is the voltage at node B, and
  R(B) is the total resistance at node B
2. Re-expand all GSB's.
  for each GSB, do:
    from the root of the GSB, for each node B having "child" nodes A1, A2, . . . Ak, do:
      for each child node Ai do:
        calculate the voltage for Ai according to:
          v(Ai)=−1*i'(Ai)/(1/r'(Ai)+i/R(B,Ai))+r'(Ai)*v(B)/(r'(Ai)+R(B,Ai))
        where:
          r'(Ai) is the effective ground resistance at node Ai,
          i'(Ai) is the effective ground current at node Ai,
          and R(A,Ai) is the original resistance between node A and Ai.
3. Re-expand all SB nodes.
  for each SB, do:
    from the root of the SB working outward towards the lead nodes, for each node A having child nodes Ai (A1, A2, A3, . . . etc.) do:
      for each child node Ai, do:
        calculate the voltage for Ai according to:
          v(Ai)=−i*R(A,Ai)+v(A) where i(Ai) is the total current at node Ai, and R(A,Ai) is the original resistance between node A and Ai.

Delay Determination

Having determined node voltages (iteratively, to produce node waveforms), the results may be compared against critical threshold voltages to determine delays for the net. Comparison of node waveforms (voltages) against (logic) threshold voltages to determine delays is widely known in the art and is incorporated into most existing delay determination schemes.

Summary of the Inventive Technique

The present inventive technique described hereinabove is generally directed to providing better delay determination for "nets" (equivalent circuits of point-to-point wiring) on integrated circuit designs by adapting general RC-mesh networks representing those "nets" to efficient nodal matrix circuit solver techniques (e.g., AWE) which are not suited to general RC-mesh circuits. This is accomplished by "collapsing" the general RC-mesh network into an RC-tree equivalent circuit (network) which can be solved (simulated) by such nodal matrix techniques, thus determining node voltages and waveforms for each of the nodes of the simplified network. After solving the simplified network, the simplified network is re-expanded into its original RC-mesh form, determining the node voltages and waveforms at the re-expanded nodes (eliminated during the collapse of the network) by applying simple circuit analysis techniques. Once all of the node waveforms have been re-constructed for all nodes of the original RC-mesh network, they can be compared against critical threshold voltages to determine net delays to each node of the network.

Figure 10:
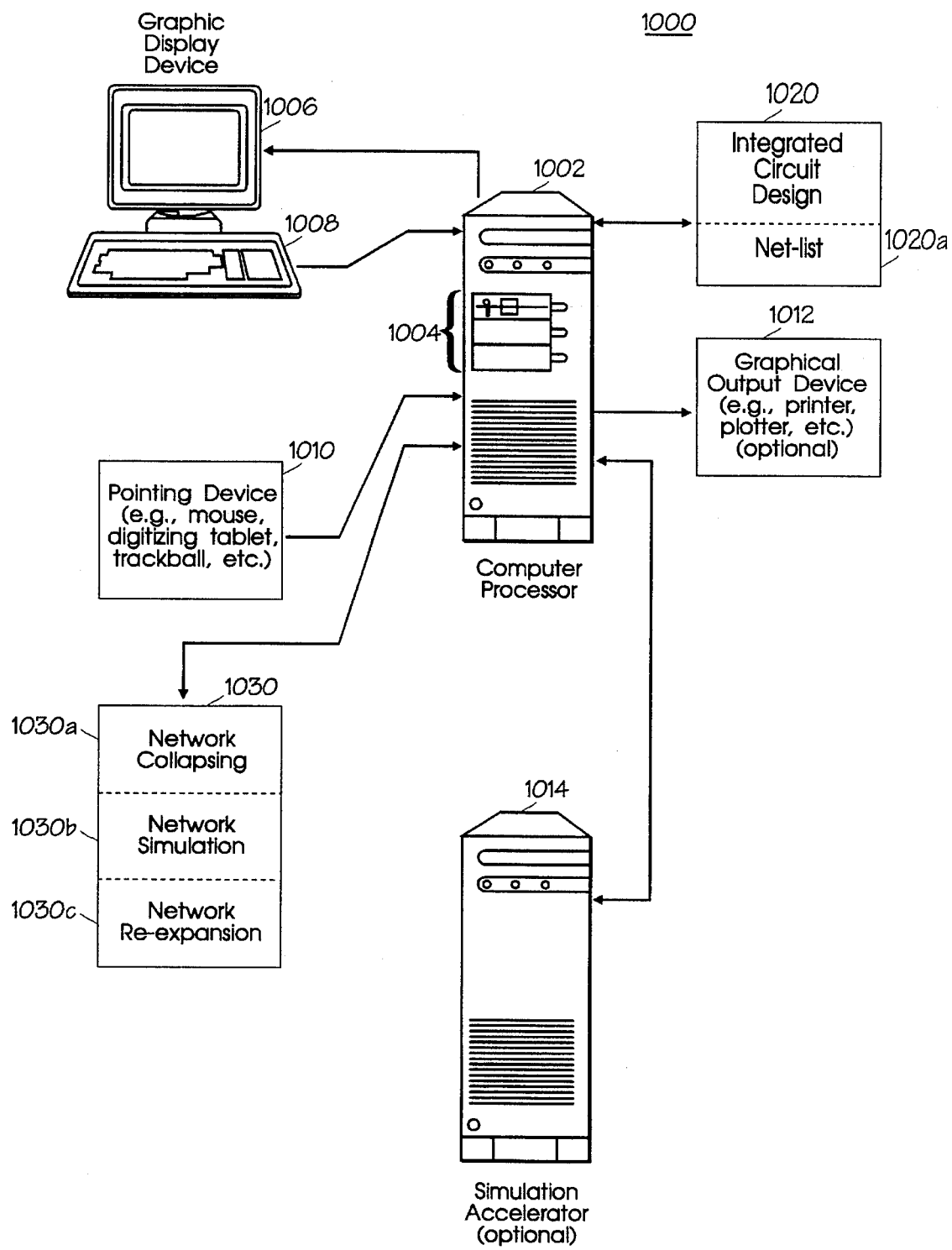
FIG. 10 is a block diagram of a system suitable for implementation of the techniques of the present invention.

The foregoing discussion with respect to the present invention has been directed generally to the inventive method, however, this method is generally applied on a computer-based semiconductor design automation system. FIG. 10 is a block diagram of a semiconductor design automation system (1000), suited to the inventive method described hereinabove.

A computer processor (1002) is provided, having mass storage devices 1004. Connected to the computer processor is a graphic display device 1006 and a keyboard (1008), through which a user may communicate with the computer processor (1002). An (optional, but generally provided) pointing device (1010) facilitates user interface with the computer processor (1002). An optional graphic output device (1020) permits hard-copy output of schematics, layout information, etc., resulting from the integrated circuit design process. Provided on the system is an integrated circuit design 1020, including a net-list 1020a, for which the user wishes to calculate net delays. To facilitate net-delay calculation, software 1030 is provided on the system, including network collapsing software 1030a, network simulation software 1030b, and network re-expansion software 1030c.

An optional simulation accelerator 1014 provides high-speed execution of the network simulation software 1030b. In the absence of the simulation accelerator 1014, the network simulation software 1030b may be executed by the computer processor 1002.

Preferably, the network collapsing software 1030a and network re-expansion software 1030c implement the network collapsing technique and network re-expansion technique, respectively, described hereinabove with respect to the present invention. Further, the network simulation software 1030b is preferably a nodal matrix type of linear system (circuit) solver, such as AWE.

TABLE 1

FIG. 3a Node Connectivity

| node | # conn. | conn. 1 | conn. 2 | conn. 3 | conn. 4 |
|------|---------|---------|---------|---------|---------|
| n1   | 1(d)    | n4      | —       | —       | —       |
| n2   | 1(d)    | n5      | —       | —       | —       |
| n3   | 1(d)    | n6      | —       | —       | —       |
| n4   | 2       | n1      | n7      | —       | —       |
| n5   | 2       | n2      | n7      | —       | —       |
| n6   | 3       | n3      | n10     | n21     | —       |
| n7   | 4       | n4      | n5      | n8      | n9      |
| n8   | 3       | n7      | n13     | n23     | —       |
| n9   | 3       | n7      | n12     | n21     | —       |
| n10  | 3       | n6      | n11     | n22     | —       |
| n11  | 3       | n10     | n18     | n19     | —       |
| n12  | 4       | n9      | n16     | n17     | n23     |
| n13  | 3       | n8      | n14     | n15     | —       |
| n14  | 1(leaf) | n13     | —       | —       | —       |
| n15  | 1(leaf) | n13     | —       | —       | —       |
| n16  | 1(leaf) | n12     | —       | —       | —       |
| n17  | 1(leaf) | n12     | —       | —       | —       |
| n18  | 1(leaf) | n11     | —       | —       | —       |
| n19  | 1(leaf) | n11     | —       | —       | —       |
| n20  | 1(leaf) | n22     | —       | —       | —       |
| n21  | 2       | n6      | n9      | —       | —       |
| n22  | 2       | n10     | n20     | —       | —       |
| n23  | 2       | n8      | n12     | —       | —       |

TABLE 2

FIG. 3a Superbranch Identification

| Superbranch Number | "From" Node | Number of Connections | "To" Node | "To" Node |
|---|---|---|---|---|
| SB1 | n8  | 1 (root) | n13 | — |
| SB1 | n13 | 2        | n14 | n15 |
| SB1 | n14 | 0 (leaf) | —   | — |
| SB1 | n15 | 0 (leaf) | —   | — |
| SB2 | n12 | 1 (root) | n16 | — |
| SB2 | n16 | 0        | —   | — |
| SB3 | n12 | 1 (root) | n17 | — |
| SB3 | n17 | 0        | —   | — |
| SB4 | n6  | 1 (root) | n10 | — |
| SB4 | n10 | 2        | n11 | n22 |
| SB4 | n11 | 1        | n18 | n19 |
| SB4 | n18 | 0 (leaf) | —   | — |
| SB4 | n19 | 0 (leaf) | —   | — |
| SB4 | n22 | 1        | n20 | — |
| SB4 | n20 | 0 (leaf) | —   | — |

TABLE 3

FIG. 3b Node Connectivity (Superbranches Collapsed)

| node | # conn. | conn. 1 | conn. 2 | conn. 3 | conn. 4 |
|------|---------|---------|---------|---------|---------|
| n1   | 1(d)    | n4      | —       | —       | —       |
| n2   | 1(d)    | n5      | —       | —       | —       |
| n3   | 1(d)    | n6      | —       | —       | —       |
| n4   | 2       | n1      | n7      | —       | —       |
| n5   | 2       | n2      | n7      | —       | —       |
| n6   | 2       | n3      | n21     | —       | —       |
| n7   | 4       | n4      | n5      | n8      | n9      |
| n8   | 2       | n7      | n23     | —       | —       |
| n9   | 3       | n7      | n12     | n21     | —       |
| n12  | 2       | n9      | n23     | —       | —       |
| n21  | 2       | n6      | n9      | —       | —       |
| n23  | 2       | n8      | n12     | —       | —       |

TABLE 4

FIG. 3b Generalized Superbranch (GSB) Identification

| GSB Number | "From" Node | Number of Connections | "To" Node | "To" Node |
|---|---|---|---|---|
| GSB1 | n7  | 1 (root) | n4  | — |
| GSB1 | n4  | 1        | n1  | — |
| GSB1 | n1  | 0 (leaf) | —   | — |
| GSB2 | n7  | 1 (root) | n5  | — |
| GSB2 | n5  | 1        | n2  | — |
| GSB2 | n2  | 0 (leaf) | —   | — |
| GSB1 | n9  | 1 (root) | n21 | — |
| GSB1 | n21 | 1        | n6  | — |
| GSB1 | n6  | 1        | n3  | — |
| GBB1 | n3  | 0 (leaf) | —   | — |

TABLE 5

FIG. 3c Node Connectivity (GSB's Collapsed)

| node | # conn. | conn. 1 | conn. 2 | conn. 3 | conn. 4 |
|------|---------|---------|---------|---------|---------|
| n7   | 2       | n8      | n9      | —       | —       |
| n8   | 2       | n7      | n23     | —       | —       |
| n9   | 2       | n7      | n12     | —       | —       |
| n12  | 2       | n9      | n23     | —       | —       |
| n23  | 2       | n8      | n12     | —       | —       |

TABLE 6

FIG. 3c Superpath (SP) Identification

| Superpath Number | "From" Node | "To" Node |
|---|---|---|
| SP1 | n7  | n8  |
| SP1 | n8  | n23 |
| SP1 | n23 | n12 |
| SP1 | n12 | n9  |
| SP1 | n9  | —   |
| SP2 | n7  | n9  |
| SP2 | n9  | —   |

TABLE 7

FIG. 4a Superbranch Node Connectivity

| node | parent | child(ren) | Res. | i[n] | i'[n] |
|------|--------|------------|------|------|-------|
| n0 | (root) | n1      | —      | i[0] | i'[0] = i[0] + i'[1] |
| n1 | n0     | n2      | R(0,1) | i[1] | i'[1] = i[1] + i'[2] |
| n2 | n1     | n3, n7  | R(1,2) | i[2] | i'[2] = i[2] + i'[3] + i'[7] |
| n3 | n2     | n4      | R(2,3) | i[3] | i'[3] = i[3] + i'[4] |
| n4 | n3     | n5, n6  | R(3,4) | i[4] | i'[4] = i[4] + i'[5] + i'[6] |

TABLE 7-continued

| FIG. 4a Superbranch Node Connectivity | | | | | |
|---|---|---|---|---|---|
| node | parent | child(ren) | Res. | i[n] | i'[n] |
| n5 | n4 | (leaf) | R(4,5) | i[5] | i[5] |
| n6 | n4 | (leaf) | R(4,6) | i[6] | i[6] |
| n7 | n3 | n8 | R(3,7) | i[7] | i'[7] = i[7] + i'[8] |
| n8 | n7 | n9 | R(7,8) | i[8] | i'[8] = i[8] + i'[9] |
| n9 | n8 | (leaf) | R(8,9) | i[9] | i[9] |

What is claimed is:

1. A method of determining the performance of nets of an integrated circuit design comprising:

providing a semiconductor design automation system;

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

each superbranch node having a ground current associated therewith;

one superbranch node from each superbranch being a superbranch root node, the remaining superbranch node being superbranch child nodes; and the step of collapsing each superbranch to a simplified node further comprising repeating, for each superbranch of each net, the steps of:

determining an effective superbranch root node ground current for the superbranch by totaling the ground currents of each superbranch node in the superbranch;

eliminating all child nodes of the superbranch; and assigning the effective superbranch root node ground current to the superbranch root node;

until all superbranches have been operated upon.

2. A method of determining the performance of nets of an integrated circuit design according to claim 1, further comprising:

comparing the node voltage waveform for each simplified node of each simplified equivalent circuit against a threshold value to determine a net delay for each such simplified node.

3. A method of determining the performance of nets of an integrated circuit design according to claim 1, further comprising:

re-expanding the simplified equivalent circuit corresponding to each net, thereby determining a node voltage for each of the first nodes of the net corresponding to the simplified equivalent circuit.

4. A method of determining the performance of nets of an integrated circuit design according to claim 3, further comprising:

comparing the node voltage waveform for each first node of each net against a threshold value to determine a net delay for each such first node.

5. A method of determining the performance of nets of an integrated circuit design according to claim 1, wherein:

the step of collapsing each net to a simplified equivalent circuit further comprises:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes.

6. A method of determining the performance of nets of an integrated circuit design according to claim 5, further comprising:

comparing the node voltage waveform for each simplified node of each simplified equivalent circuit against a threshold value to determine a net delay for each such simplified node.

7. A method of determining the performance of nets of an integrated circuit design according to claim 5, further comprising:

re-expanding the simplified equivalent circuit corresponding to each net to determine a node voltage for each of the first nodes of the net corresponding to the simplified equivalent circuit.

8. A method of determining the performance of nets of an integrated circuit design according to claim 7, further comprising:

comparing the node voltage waveform for each first node of each net against a threshold value to determine a net delay for each such first node.

9. A method of determining the performance of nets of an integrated circuit design according to claim 7, wherein:

the step of re-expanding each simplified equivalent circuit further comprises:

re-expanding each superpath of each net from the simplified equivalent circuit associated with each such superpath to determine a node voltage waveform for each superpath node of each such superpath;

re-expanding each generalized superbranch of each net from the simplified equivalent circuit associated with each such generalized superbranch to determine a node voltage waveform for each generalized superbranch node of each such generalized superbranch; and re-expanding each superbranch of each net from the simplified equivalent circuit associated with each such superbranch to determine a node voltage waveform for each node of each such superpath.

10. A method of determining the performance of nets of an integrated circuit design according to claim 9, further comprising:

comparing the node voltage waveform for each first node of each net against a threshold value to determine a net delay for each such first node.

11. A method of determining the performance of nets of an integrated circuit design according to claim 9, comprising:

providing a semiconductor design automation system;

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

re-expanding the simplified equivalent circuit corresponding to each net to determine a node voltage for each of the first nodes of the net corresponding to the simplified equivalent circuit;

the step of re-expanding each simplified equivalent circuit further comprising re-expanding each superpath of each net from the simplified equivalent circuit associated with each such superpath to determine a node voltage waveform for each superpath node of each such superpath;

re-expanding each generalized superbranch of each net from the simplified equivalent circuit associated with each such generalized superbranch to determine a node voltage waveform for each generalized superbranch node of each such generalized superbranch; and re-expanding each superbranch of each net from the simplified equivalent circuit associated with each such superbranch to determine a node voltage waveform for each node of each such superpath;

each superbranch node having a ground current associated therewith;

one superbranch node from each superbranch being a superbranch root node, the remaining superbranch node being superbranch child nodes;

the step of collapsing each superbranch to a simplified node further comprising repeating, for each superbranch of each net, the steps of:

determining an effective superbranch root node ground current for the superbranch by totaling the ground currents of each superbranch node in the superbranch;

eliminating all child nodes of the superbranch;

assigning the effective superbranch root node ground current to the superbranch root node; and designating the superbranch root node as a simplified node and as a non-eliminated superbranch node;

until all superbranches have been operated upon; and the step of re-expanding each superbranch further comprising repeating, for each superbranch of each net, the steps of:

repeating, for each non-eliminated superbranch node "A" starting with the superbranch root node, the steps of:

repeating for each eliminated superbranch child node "Ai" connected to the non-eliminated superbranch node A prior to its elimination, the steps of:

re-establish the connection between superbranch child node Ai and non-eliminated superbranch node A;

designating the superbranch child node as a non-eliminated superbranch node; and calculating a node voltage for superbranch child node Ai according to:

$$v(Ai) = -1 * R(A,Ai) + v(A)$$

where i(Ai) is the total current at node Ai, and R(A,Ai) is the series resistance between the non-eliminated superbranch node A and the superbranch child node Ai and v(a) is the voltage at superbranch node A;

until all such eliminated superbranch child nodes Ai have been re-connected to the non-eliminated superbranch node A;

until all non-eliminated superbranch nodes, including those superbranch nodes newly designated as non-eliminated superbranch nodes, have been operated upon;

until all superbranches have been operated upon.

12. A method of determining the performance of nets of an integrated circuit design according to claim 11, further comprising:

comparing the node voltage waveform for each first node of each net against a threshold value to determine a net delay for each such first node.

13. A method of determining the performance of nets of an integrated circuit design comprising:

providing a semiconductor design automation system;

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

re-expanding the simplified equivalent circuit corresponding to each net to determine a node voltage for each of the first nodes of the net corresponding to the simplified equivalent circuit;

the step of re-expanding each simplified equivalent circuit further comprising re-expanding each superpath of each net from the simplified equivalent circuit associated with each such superpath to determine a node voltage waveform for each superpath node of each such superpath;

re-expanding each generalized superbranch of each net from the simplified equivalent circuit associated with each such generalized superbranch to determine a node voltage waveform for each generalized superbranch node of each such generalized superbranch; and re-expanding each superbranch of each net from the simplified equivalent circuit associated with each such superbranch to determine a node voltage waveform for each node of each such superpath;

each generalized superbranch node having a ground current and a ground resistance associated therewith;

one generalized superbranch node of each generalized superbranch being a generalized superbranch root node, the remaining nodes being generalized superbranch child nodes;

each generalized superbranch child node connecting to exactly one generalized superbranch parent node via a series resistance between the generalized superbranch child node and the generalized superbranch parent node;

each generalized superbranch having one or more generalized superbranch child nodes which are not themselves generalized superbranch parent nodes, but each of which is a generalized superbranch child node connected to a generalized superbranch parent node, and for which an effective ground current associated with the generalized superbranch child node is equal to the ground current associated with the generalized superbranch parent node and for which an effective ground resistance associated with the generalized superbranch child node is equal to the ground resistance associated with the generalized superbranch node;

identifying each superbranch leaf node as a net endpoint that connects to only one other node in the net, and each generalized superbranch node which is not a generalized superbranch leaf node as a generalized superbranch parent node connected to one or more generalized superbranch child nodes via one of the series resistances;

the step of collapsing each generalized superbranch to a simplified node further comprises:

repeating, for each generalized superbranch, the steps of:
starting with the generalized superbranch leaf nodes and progressing towards the generalized superbranch root node, for each group "A" of one or more generalized superbranch child nodes "Ai" connecting to a common generalized superbranch parent node "B", repeating the steps of:
repeating, for each generalized superbranch child node "Ai" in the group of generalized superbranch child nodes "A", the steps of:
computing a contributed effective ground resistance r'(B,Ai) associated with the generalized superbranch child node Ai according to the equation:

$$r'(B,Ai) = r'[Ai] + R(Ai,B)$$

where r'[Ai] represents the effective ground resistance at the generalized superbranch node Ai, and R(Ai,B) represents the series resistance between the generalized superbranch child node Ai and the generalized superbranch parent node B;

computing a contributed effective ground current i'(B,Ai) from the generalized superbranch child node Ai to the generalized superbranch node B according to the equation:

$$i'(B,Ai) = \frac{i'[Ai] r'[Ai]}{r'[Ai] + R(B,Ai)}$$

where i'[Ai] represents the ground current associated with the generalized superbranch child node Ai, and R(B,Ai) represents the series resistance between the generalized superbranch child node Ai and the generalized superbranch parent node B; and eliminating the child node Ai;

until all generalized superbranch child nodes Ai in the group "A" of generalized superbranch child nodes have been eliminated;
calculating a total effective ground resistance r'[B] for the generalized superbranch parent node B, by determining the equivalent resistance value of a parallel combination of the ground resistance at generalized superbranch parent node B and each of the contributed effective ground resistances r'(B,Ai) from the generalized superbranch child nodes Ai connected via one of the series resistances to the generalized superbranch parent node B; and
calculating a total effective ground current i'[B] for the generalized superbranch parent node B by totaling the ground current i[B] for generalized superbranch parent node B and all of the contributed effective ground currents i'(B,Ai) from each of the generalized superbranch child nodes Ai connected via one of the series resistances to generalized superbranch parent node B;
until all groups "A" have been operated upon;
until all generalized superbranches have been operated upon; and
designating the generalized superbranch root node of each generalized superbranch as a simplified node; and
the step of re-expanding each generalized superbranch further comprises:
repeating, for each generalized superbranch "C", the step of:
repeating, for each generalized superbranch parent node "B" of the generalized superbranch C, starting with the generalized superbranch root node and working outward, the step of:
repeating, for each eliminated generalized superbranch child node "Ai" connected to the generalized superbranch parent node "B" prior to its elimination, the steps of:
re-connecting the eliminated generalized superbranch child node Ai to the generalized superbranch parent node B; and
calculating a node voltage for the generalized superbranch child node Ai, according to the formula:

$$v(Ai) = \frac{1}{R(B,Ai) + r'[Ai]} \, v(B) - \frac{i'[Ai]}{\frac{1}{r'[Ai]} + \frac{1}{R(B,Ai)}}$$

where r'[Ai] is the effective ground resistance at node Ai, i'[Ai] is the effective ground current at node Ai, and R(B,Ai) is the series resistance between node B and Ai;
until all generalized superbranch child nodes Ai have been reconnected to the generalized superbranch node B;
until all generalized superbranch parent nodes of the generalized superbranch C have been operated upon;
until all generalized superbranches C have been operated upon.

14. A method of determining the performance of nets of an integrated circuit design according to claim 13, further comprising:
comparing the node voltage waveform for each first node of each net against a threshold value to determine a net delay for each such first node.

15. A method of determining the performance of nets of an integrated circuit design comprising:
providing a semiconductor design automation system;
providing an integrated circuit design on the semiconductor design automation system, said integrated circuit design including a net-list, said net list including a plurality of nets, each net representing a plurality of interconnected first nodes;
collapsing each net to a corresponding simplified equivalent circuit having a number of simplified nodes less than or equal to the plurality of first nodes represented by the net corresponding to the simplified equivalent circuit; and
simulating the simplified equivalent circuit for each of the plurality of nets, thereby determining a node voltage waveform for each simplified node of the corresponding simplified equivalent circuit;
the step of collapsing each net to a simplified equivalent circuit further comprising:
identifying superbranches of each net, each superbranch including a first subset of the plurality of first nodes, each node in the first subset being a superbranch node;
collapsing each superbranch of each net to a simplified node;
identifying generalized superbranches of each net, each superbranch including a second subset of the plurality of first nodes, each node in the second subset being a generalized superbranch node;
collapsing each generalized superbranch of each net to a simplified node;
identifying superpaths of each net, each superbranch including a third subset of the plurality of first nodes, each node in the third subset being a superpath node; and
collapsing each superpath of each net to two simplified nodes;
re-expanding the simplified equivalent circuit corresponding to each net to determine a node voltage for each of the first nodes of the net corresponding to the simplified equivalent circuit;
the step of re-expanding each simplified equivalent circuit further comprising:
re-expanding each superpath of each net from the simplified equivalent circuit associated with each such superpath to determine a node voltage waveform for each superpath node of each such superpath;
re-expanding each generalized superbranch of each net from the simplified equivalent circuit associated with each such generalized superbranch to determine a node voltage waveform for each generalized superbranch node of each such generalized superbranch; and
re-expanding each superbranch of each net from the simplified equivalent circuit associated with each such superbranch to determine a node voltage waveform for each node of each such superpath;
each superpath node has a ground current associated therewith;
two of the superpath nodes of each superpath are endpoint nodes one of which is a starting node and another of which is an ending node, the remaining superpath nodes of each superpath being intermediate nodes and being arranged in a serially connected fashion between the starting node and the ending node such that each intermediate node is connected to each of two neighboring intermediate nodes via a series resistance, and such that each intermediate node of a superpath has a next intermediate node next in serial sequence towards the ending node;

an effective series resistance between the starting node and a first intermediate node neighboring the starting node is equal to the series resistance between the starting node and the first intermediate node;

an effective ground current at the first intermediate node neighboring the starting node is equal to the ground current associated with the first intermediate node;

the step of collapsing each superpath to two simplified nodes further comprises:

repeating, for each superpath, the steps of:

setting an effective ground current for the starting node equal to the ground current associated with the starting node;

repeating, for each intermediate node "A" along the superpath having a next superpath node "B" nearer the ending node, starting with the intermediate node nearest the starting node "S", progressing one node at a time towards the ending node "E", the steps of:

eliminating the intermediate node A from the superpath;

calculating and inserting an effective series resistance from the starting node S to the next superpath node B according to:

$$R'(S,B) = R'(S,A) + R(B,A)$$

where R'(S,A) is the effective series between the starting node S and the intermediate node A, and R(B,A) is the resistance between the intermediate nodes A and the next superpath node B;

calculating an effective ground current at the next superpath node B resulting from the effective ground current associated with intermediate node A according to the equation:

$$i'[B] = \frac{R'(S,A)}{R'(S,B)} \; i'[A] + i[B]$$

where i'[A] is the effective ground current at the intermediate node A, and i[B] is the ground current associated with the next superpath node B; and calculating an effective ground current at the starting node S resulting from an effective ground current at the intermediate node A according to the equation:

$$i'[S] = \frac{R'(B,A)}{R'(S,B)} \; i'[A] + i'[S]$$

where i'[S] is the effective ground current at the starting node, and i'[S] is updated each time it is calculated;

until all intermediate nodes A have been eliminated; and designating the starting node S and the ending node E as simplified nodes;

until all superpaths have been operated upon; and the step of re-expanding each superpath further comprising:

repeating, for each superpath "C", the step of:

repeating, for each next superpath node "B" of the superpath C connected to an eliminated intermediate node "A" prior to the elimination of intermediate node A, starting at the ending node and working towards the starting node "S", the steps of:

re-inserting the eliminated intermediate node A into the superpath C between the starting node S and the next superpath node B; and calculating a node voltage for the intermediate node A according to the formula:

$$v(A) = \frac{\frac{R'(S,A)}{R'(S,B)} \; v(B) + \frac{R(A,B)}{R'(S,B)} \; v(S) - i'[A]}{\frac{1}{R'(S,A)} + \frac{1}{R(A,B)}}$$

where i'[A] is the effective ground current associated with the intermediate node A, R'(S,A) is the effective series resistance between the intermediate node A and the starting node S of the superpath C, R'(S,B) is the effective series resistance between the next superpath node B and the starting node S of the superpath C, R(A,B) is the series resistance between the intermediate node A and the next superpath node B, v(B) is the node voltage at the next superpath node B, and R(B) is the ground resistance at the next superpath node B;

until all intermediate nodes of the superpath C are re-inserted;

until all superpaths C have been operated upon.

16. A method of determining the performance of nets of an integrated circuit design according to claim 15, further comprising:

comparing the node voltage waveform for each first node of each net against a threshold value to determine a net delay for each such first node.

17. A method of determining the performance of nets of an integrated circuit design comprising:

providing a semiconductor design automation system;

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

re-expanding the simplified equivalent circuit corresponding to each net to determine a node voltage for each of the first nodes of the net corresponding to the simplified equivalent circuit;

the step of re-expanding each simplified equivalent circuit further comprising:

re-expanding each superpath of each net from the simplified equivalent circuit associated with each such superpath to determine a node voltage waveform for each superpath node of each such superpath;

re-expanding each generalized superbranch of each net from the simplified equivalent circuit associated with each such generalized superbranch to determine a node voltage waveform for each generalized superbranch node of each such generalized superbranch; and re-expanding each superbranch of each net from the simplified equivalent circuit associated with each such superbranch to determine a node voltage waveform for each node of each such superpath;

each superbranch node has a ground current associated therewith;

one superbranch node from each superbranch is a superbranch root node, the remaining superbranch node being superbranch child nodes;

each generalized superbranch node has a ground current and a ground resistance associated therewith;

one generalized superbranch node of each generalized superbranch is a generalized superbranch root node, the remaining nodes being generalized superbranch child nodes;

each generalized superbranch child node connects to exactly one generalized superbranch parent node via a series resistance between the generalized superbranch child node and the generalized superbranch parent node;

each generalized superbranch has one or more generalized superbranch child nodes which are not themselves generalized superbranch parent nodes, but each of which is a generalized superbranch child node connected to a generalized superbranch parent node, and for which an effective ground current associated with the generalized superbranch child node is equal to the ground current associated with the generalized superbranch parent node and for which an effective ground resistance associated with the generalized superbranch child node is equal to the ground resistance associated with the generalized superbranch parent node;

each generalized superbranch node which is not a generalized superbranch leaf node is a generalized superbranch parent node connected to one or more generalized superbranch child nodes via one of the series resistances;

each superpath node has a ground current associated therewith;

two of the superpath nodes of each superpath are endpoint nodes one of which is a starting node and another of which is an ending node, the remaining superpath nodes of each superpath being intermediate nodes and being arranged in a serially connected fashion between the starting node and the ending node such that each intermediate node is connected to each of two neighboring intermediate nodes via a series resistance, and such that each intermediate node of a superpath has a next intermediate node next in serial sequence towards the ending node;

an effective series resistance between the starting node and a first intermediate node neighboring the starting node is equal to the series resistance between the starting node and the first intermediate node;

an effective ground current at the first intermediate node neighboring the starting node is equal to the ground current associated with the first intermediate node;

the step of collapsing each superbranch to a simplified node further comprises repeating, for each superbranch of each net, the steps of:

determining an effective superbranch root node ground current for the superbranch by totaling the ground currents each superbranch node in the superbranch;

eliminating all child nodes of the superbranch;

assigning the effective superbranch root node ground current to the superbranch root node; and designating the superbranch root node as a simplified node and as a non-eliminated superbranch node;

until all superbranches have been operated upon;

the step of collapsing each generalized superbranch to a simplified node further comprises:

repeating, for each generalized superbranch, the steps of:

identifying each superbranch leaf node as a net and point that connects to only the one other node in the net;

starting with the generalized superbranch leaf nodes and progressing towards the generalized superbranch root node, for each group "A" of one or more generalized superbranch child nodes "Ai" connecting to a common generalized superbranch parent node "B", repeating the steps of:

repeating, for each generalized superbranch child node "Ai" in the group of generalized superbranch child nodes "A", the steps of:

computing a contributed effective ground resistance r'(B,Ai) associated with the generalized superbranch child node Ai according to the equation:

$$r'(B,Ai) = r'[Ai] + R(Ai,B)$$

where r'[Ai] represents the effective ground resistance at the generalized superbranch node Ai, and R(Ai, B) represents the series resistance between the generalized superbranch child node Ai and the generalized superbranch parent node B;

computing a contributed effective ground current i'(B,Ai) from the generalized superbranch child node Ai to the generalized superbranch node B according to the equation:

$$i'(B,Ai) = \frac{i'[Ai]r'[Ai]}{r'[Ai] + R(B,Ai)}$$

where i'[Ai] represents the ground current associated with the generalized superbranch child node Ai, and R(B,Ai) represents the series resistance between the generalized superbranch child node Ai and the generalized superbranch parent node B; and eliminating the child node Ai;

until all generalized superbranch child nodes Ai in the group "A" of generalized superbranch child nodes have been eliminated:

calculating a total effective ground resistance r'[B] for the generalized superbranch parent node B, by determining the equivalent resistance value of a parallel combination of the ground resistance at generalized superbranch parent node B and each of the contributed effective ground resistances r'(B,Ai) from the generalized superbranch child nodes Ai connected via one of the series resistances to the generalized superbranch parent node B; and calculating a total effective ground current i'[B] for the generalized superbranch parent node B by totaling the ground current i[B] for generalized superbranch parent node B and all of the contributed effective ground currents i'(B,Ai) from each of the generalized superbranch child nodes Ai connected via one of the series resistances to generalized superbranch parent node B;

until all groups "A" have been operated upon;

until all generalized superbranches have been operated upon; and designating the generalized superbranch root node of each generalized superbranch as a simplified node;

the step of collapsing each superpath to two simplified nodes further comprises:

repeating, for each superpath, the steps of:

setting an effective ground current for the starting node equal to the ground current associated with the starting node;

repeating, for each intermediate node "A" along the superpath having a next superpath node "B" nearer the ending node, starting with the intermediate node nearest the starting node "S," progressing one node at a time towards the ending node "E", the steps of:

eliminating the intermediate node A from the superpath;

calculating and inserting an effective series resistance from the starting node S to the next superpath node B according to:

$R'(S,B) = R'(S,A) + R(B,A)$ where R'(S,A) is the effective series between the starting node S and the intermediate node A, and R(B,A) is the resistance between the intermediate nodes A and the next superpath node B;

calculating an effective ground current at the next superpath node B resulting from the effective ground current associated with intermediate node A according to the equation:

$$i'[B] = \frac{R'(S,A)}{R'(S,B)} \; i'[A] + i[B]$$

where i'[A] is the effective ground current at the intermediate node A, and i[B] is the ground current associated with the next superpath node B; and calculating an effective ground current at the starting node S resulting from an effective ground current at the intermediate node A according to the equation:

$$i'[S] = \frac{R'(B,A)}{R'(S,B)} \; i'[A] + i'[S]$$

where i'[S] is the effective ground current at the starting node, and i'[S] is updated each time it is calculated;

until all intermediate nodes A have been eliminated; and designating the starting node S and the ending node E as simplified nodes;

until all superpaths have been operated upon;

the step of re-expanding each superpath further comprising:

repeating, for each superpath "C", the step of:

repeating, for each next superpath node "B" of the superpath C connected to an eliminated intermediate node "A" prior to the elimination of intermediate node A, starting at the ending node and working towards the starting node "S", the steps of:

re-inserting the eliminated intermediate node A into the superpath C between the starting node S and the next superpath node B; and calculating a node voltage for the intermediate node A according to the formula:

$$v(A) = \frac{R'(S,A)}{R'(S,B)} \; v(B) + \frac{R(A,B)}{R'(S,B)} \; v(S) - \frac{i'[A]}{\frac{1}{R'(S,A)} + \frac{1}{R(A,B)}}$$

where i'[A] is the effective ground current associated with the intermediate node A, R'(S,A) is the effective series resistance between the intermediate node A and the starting node S of the superpath C, R'(S,B) is the effective series resistance between the next superpath node B and the starting node S of the superpath C, R(A,B) is the series resistance between the intermediate node A and the next superpath node B, v(B) is the node voltage at the next superpath node B, and R(B) is the ground resistance at the next superpath node B;

until all intermediate nodes of the superpath C are re-inserted;

until all superpaths C have been operated upon;

the step of re-expanding each generalized superbranch further comprising:

repeating, for each generalized superbranch "C", the step of:

repeating, for each generalized superbranch parent node "B" of the generalized superbranch C, starting with the generalized superbranch root node and working outward, the step of:

repeating, for each eliminated generalized superbranch child node "Ai" connected to the generalized superbranch parent node "B" prior to its elimination, the steps of:

re-connecting the eliminated generalized superbranch child node Ai to the generalized superbranch parent node B; and calculating a node voltage for the generalized superbranch child node Ai, according to the formula:

$$v(Ai) = \frac{1}{R(B,Ai) + r'[Ai]} v(B) - \frac{i'[Ai]}{\frac{1}{r'[Ai]} + \frac{1}{R(B,Ai)}}$$

where r'[Ai] is the effective ground resistance at node Ai,i'[Ai] is the effective ground current at node Ai, and R(B,Ai) is the series resistance between node A and Ai;

until all generalized superbranch child nodes Ai have been reconnected to the generalized superbranch node B;

until all generalized superbranch parent nodes of the generalized superbranch C have been operated upon;

until all generalized superbranches C have been operated upon; and the step of re-expanding each superbranch further comprising:

repeating, for each superbranch of each net, the steps of:

repeating, for each non-eliminated superbranch node "A" starting with the superbranch root node, the steps of:

repeating for each eliminated superbranch child node "Ai" connected to the non-eliminated superbranch node A prior to its elimination, the steps of:

re-establishing the connection between superbranch child node Ai and non-eliminated superbranch node A;

designating the superbranch child node as a non-eliminated superbranch node; and calculating a node voltage for superbranch child node Ai according to:

$$v(Ai) = -1*R(A,Ai) + v(A)$$

where i(Ai) is the total current at node Ai, and R(A,Ai) is the series resistance between the non-eliminated superbranch node A and the superbranch child node Ai, and v(A) is the voltage at superbranch node A;

until all such eliminated superbranch child nodes Ai have been re-connected to the non-eliminated superbranch node A;

until all non-eliminated superbranch nodes, including those superbranch nodes newly designated as non-eliminated superbranch nodes, have been operated upon;

until all superbranches have been operated upon.

18. A method of determining the performance of nets of an integrated circuit design according to claim 7, further comprising:

comparing the node voltage waveform for each first node of each net against a threshold value to determine a net delay for each such first node.

19. A method of determining the performance of nets of an integrated circuit design comprising:

providing a semiconductor design automation system:

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

each superbranch node having a ground current associated therewith;

one superbranch node from each superbranch being a superbranch root node, the remaining superbranch node being superbranch child nodes; and the step of collapsing each superbranch to a simplified node further comprising repeating, for each superbranch of each net, the steps of:

determining an effective superbranch root node ground current for the superbranch by totaling the ground currents of each superbranch node in the superbranch;

eliminating all child nodes of the superbranch;

assigning the effective superbranch root node ground current to the superbranch root node; and designating the superbranch root node as a simplified node;

until all superbranches have been operated upon.

20. A method of determining the performance of nets of an integrated circuit design according to claim 19, further comprising:

comparing the node voltage waveform for each first node of each net against a threshold value to determine a net delay for each such simplified node.

21. A method of determining the performance of nets of an integrated circuit design according to claim 19, further comprising:

re-expanding the simplified equivalent circuit corresponding to each net, thereby determining a node voltage for each of the first nodes of the net corresponding to the simplified equivalent circuit.

22. A method of determining the performance of nets of an integrated circuit design according to claim 21, further comprising:

comparing the node voltage waveform for each first node of each net against a threshold value to determine a net delay for each such first node.

23. A method of determining the performance of nets of an integrated circuit design comprising:

providing a semiconductor design automation system;

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

each generalized superbranch node having a ground current and a ground resistance associated therewith;

one generalized superbranch node of each generalized superbranch being a generalized superbranch root node, the remaining nodes being generalized superbranch child nodes;

each generalized superbranch child node connecting to exactly one generalized superbranch parent node via a series resistance between the generalized superbranch child node and the generalized superbranch parent node;

each generalized superbranch having one or more generalized superbranch child nodes which are not themselves generalized superbranch parent nodes, each of which being a generalized superbranch child node connected to a generalized superbranch parent node, and for which an effective ground current associated with a generalized superbranch child node is equal to the ground current associated with a generalized superbranch parent node and for which an effective ground resistance associated with a generalized superbranch child node is equal to the ground resistance associated with a generalized superbranch parent node;

identifying each superbranch leaf node as a net endpoint that connects to only one other node in the net, and each generalized superbranch node which is not a generalized superbranch leaf node as a generalized superbranch parent node connected to one or more generalized superbranch child nodes via one of the series resistances;

the step of collapsing each generalized superbranch to a simplified node further comprises:

repeating, for each generalized superbranch, the steps of:

starting with the generalized superbranch leaf nodes and progressing towards the generalized superbranch root node, for each group "A" of one or more generalized superbranch child nodes "Ai" connecting to a common generalized superbranch parent node "B", repeating the steps of:

repeating, for each generalized superbranch child node "Ai" in the group of generalized superbranch child nodes "A", the steps of:

computing a contributed effective ground resistance r'(B,Ai) associated with the generalized superbranch child node Ai according to the equation:

$$r'(B,Ai)=r'[Ai]+R(Ai,B)$$

where r'[Ai] represents the effective ground resistance at the generalized superbranch node Ai, and R(Ai, B) represents the series resistance between the generalized superbranch child node Ai and the generalized superbranch parent node B;

computing a contributed effective ground current i'(B,Ai) from the generalized superbranch child node Ai to the generalized superbranch node B according to the equation:

$$i'(B,Ai) = \frac{i'[Ai]r'[Ai]}{r'[Ai] + R(B,Ai)}$$

where i'[Ai] represents the ground current associated with the generalized superbranch child node Ai, and R(B,Ai) represents the series resistance between the generalized superbranch child node Ai and the generalized superbranch parent node B; and eliminating the child node Ai;

until all generalized superbranch child nodes Ai in the group "A" of generalized superbranch child nodes have been eliminated;

calculating a total effective ground resistance r'[B] for the generalized superbranch parent node B, by determining the equivalent resistance value of a parallel combination of the ground resistance at generalized superbranch parent node B and each of the contributed effective ground resistances r'(B,Ai) from the generalized superbranch child nodes Ai connected via one of the series resistances to the generalized superbranch parent node B; and calculating a total effective ground current i'[B] for the generalized superbranch parent node B by totaling the ground current i[B] for generalized superbranch parent node B and all of the contributed effective ground currents i'(B,Ai) from each of the generalized superbranch child nodes Ai connected via one of the series resistances to generalized superbranch parent node B;

until all groups "A" have been operated upon;

until all generalized superbranches have been operated upon; and designating the generalized superbranch root node of each generalized superbranch as a simplified node.

24. A method of determining the performance of nets of an integrated circuit design according to claim 23, further comprising:

comparing the node voltage waveform for each first node of each net against a threshold value to determine a net delay for each such simplified node.

25. A method of determining the performance of nets of an integrated circuit design according to claim 23, further comprising:

re-expanding the simplified equivalent circuit corresponding to each net to determine a node voltage for each of the first nodes of the net corresponding to the simplified equivalent circuit.

26. A method of determining the performance of nets of an integrated circuit design according to claim 25, further comprising:

comparing the node voltage waveform for each first node of each net against a threshold value to determine a net delay for each such first node.

27. A method of determining the performance of nets of an integrated circuit design comprising:

providing a semiconductor design automation system;

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

each superpath node node has a ground current associated therewith;

two of the superpath nodes of each superpath are endpoint nodes one of which is a starting node and another of which is an ending node, the remaining superpath nodes of each superpath being intermediate nodes and being arranged in a serially connected fashion between the starting node and the ending node such that each intermediate node is connected to each of two neighboring intermediate nodes via a series resistance, and such that each intermediate node of a superpath has a next intermediate node next in serial sequence towards the ending node;

an effective series resistance between the starting node and a first intermediate node neighboring the starting node is equal to the series resistance between the starting node and the first intermediate node;

an effective ground current at the first intermediate node neighboring the starting node is equal to the ground current associated with the first intermediate node; and the step of collapsing each superpath to two simplified nodes further comprises:

repeating, for each superpath, the steps of:

setting an effective ground current for the starting node equal to the ground current associated with the starting node;

repeating, for each intermediate node "A" along the superpath having a next superpath node "B" nearer the ending node, starting with the intermediate node nearest the starting node "S", progressing one node at a time towards the ending node "E", the steps of:

eliminating the intermediate node A from the superpath;

calculating and inserting an effective series resistance from the starting node S to the next superpath node B according to:

$$R'(S,B)=R'(S,A)+R(B,A)$$

where R'(S,A) is the effective series between the starting node S and the intermediate node A, and R(B,A) is the resistance between intermediate nodes A and the next the superpath node B;

calculating an effective ground current at the next superpath node B resulting from the effective ground current associated with intermediate node A according to the equation:

$$i'[B] = \frac{R(S,A)}{R'(S,B)} \; i'[A] + i'[B]$$

where i'[A] is the effective ground current at the intermediate node A, and i[B] is the ground current associated with the next superpath node B; and calculating an effective ground current at the starting node S resulting from an effective ground current at the intermediate node A according to the equation:

$$i'[S] = \frac{R'(B,A)}{R'(S,B)} \; i'[A] + i'[S]$$

where i'[S] is the effective ground current at the starting node, and i'[S] is updated each time it is calculated;

until all intermediate nodes A have been eliminated; and designating the starting node S and the ending node E as simplified nodes;

until all superpaths have been operated upon.

28. A method of determining the performance of nets of an integrated circuit design according to claim 27, further comprising:

comparing the node voltage waveform for each first node of each net against a threshold value to determine a net delay for each such simplified node.

29. A method of determining the performance of nets of an integrated circuit design according to claim 27, further comprising:

re-expanding the simplified equivalent circuit corresponding to each net to determine a node voltage for each of the first nodes of the net corresponding to the simplified equivalent circuit.

30. A method of determining the performance of nets of an integrated circuit design according to claim 29, further comprising:

comparing the node voltage waveform for each first node of each net against a threshold value to determine a net delay for each such first node.

31. A method of determining the performance of nets of an integrated circuit design comprising:

providing a semiconductor design automation system;

providing an integrated circuit design on the semiconductor design automation system, said integrated circuit design including a net-list, said net list including a plurality of nets, each net representing a plurality of interconnected first nodes;

collapsing each net to a corresponding simplified equivalent circuit having a number of simplified nodes less than or equal to the plurality of first nodes represented by the net corresponding to the simplified equivalent circuit; and simulating the simplified equivalent circuit for each of the plurality of nets, thereby determining a node voltage waveform for each simplified node of the corresponding simplified equivalent circuit;

the step of collapsing each net to a simplified equivalent circuit further comprising:

identifying superbranches of each net, each superbranch including a first subset of the plurality of first nodes, each node in the first subset being a superbranch node;

collapsing each superbranch of each net to a simplified node;

identifying generalized superbranches of each net, each superbranch including a second subset of the plurality of first nodes, each node in the second subset being a generalized superbranch node;

collapsing each generalized superbranch of each net to a simplified node;

identifying superpaths of each net, each superbranch including a third subset of the plurality of first nodes, each node in the third subset being a superpath node; and collapsing each superpath of each net to two simplified nodes;

each superbranch node has a ground current associated therewith;

one superbranch node from each superbranch is a superbranch root node, the remaining superbranch node being superbranch child nodes;

each generalized superbranch node has a ground current and a ground resistance associated therewith;

one generalized superbranch node of each generalized superbranch is a generalized superbranch root node, the remaining nodes being generalized superbranch child nodes;

each generalized superbranch child node connects to exactly one generalized superbranch parent node via a series resistance between the generalized superbranch child node and the generalized superbranch parent node;

each generalized superbranch has one or more generalized superbranch child nodes which are not themselves generalized superbranch parent nodes, but each of which is a generalized superbranch child node connected to a generalized superbranch parent node, and for which an effective ground current associated with a generalized superbranch child node is equal to the ground current associated with a generalized superbranch parent node and for which an effective ground resistance associated with a generalized superbranch child node is equal to the ground resistance associated with a generalized superbranch parent node;

identifying each superbranch leaf node as a net end point that connects to only one other node in the net, and each generalized superbranch node which is not a generalized superbranch leaf node as a generalized superbranch parent node connected to one or more generalized superbranch child nodes via one of the series resistances;

each superpath node has a ground current associated therewith;

two of the superpath nodes of each superpath are endpoint nodes one of which is a starting node and another of which is an ending node, the remaining superpath nodes of each superpath being intermediate nodes and being arranged in a serially connected fashion between the starting node and the ending node such that each intermediate node is connected to each of two neighboring intermediate nodes via a series resistance, and such that each intermediate node of a superpath has a next intermediate node next in serial sequence towards the ending node;

an effective series resistance between the starting node and a first intermediate node neighboring the starting node is equal to the series resistance between the starting node and the first intermediate node;

an effective ground current at the first intermediate node neighboring the starting node is equal to the ground current associated with the first intermediate node;

the step of collapsing each superbranch to a simplified node further comprises repeating, for each superbranch of each net, the steps of:

determining an effective superbranch root node ground current for the superbranch by totaling the ground currents of each superbranch node in the superbranch;

eliminating all child nodes of the superbranch;

assigning the effective superbranch root node ground current to the superbranch root node; and designating the superbranch root node as a simplified node;

until all superbranches have been operated upon;

the step of collapsing each generalized superbranch to a simplified node further comprises:

repeating, for each generalized superbranch, the steps of:
  starting with the generalized superbranch leaf nodes and progressing towards the generalized superbranch root node, for each group "A" of one or more generalized superbranch child nodes "Ai" connecting to a common generalized superbranch parent node "B", repeating the steps of:
    repeating, for each generalized superbranch child node "Ai" in the group of generalized superbranch child nodes "A", the steps of:
      computing a contributed effective ground resistance r'(B,Ai) associated with the generalized superbranch child node Ai according to the equation:

$$r'(B,Ai) = r'[Ai] + R(Ai, B)$$

where r'[Ai] represents the effective ground resistance at the generalized superbranch node Ai, and R(Ai,B) represents the series resistance between the generalized superbranch child node Ai and the generalized superbranch parent node B;
      computing a contributed effective ground current i'(B,Ai) from the generalized superbranch child node Ai to the generalized superbranch node B according to the equation:

$$i'(B,Ai) = \frac{i'[Ai]r'[Ai]}{r'[Ai] + R(B,Ai)}$$

where i'[Ai] represents the ground current associated with the generalized superbranch child node Ai, and R(B,Ai) represents the series resistance between the generalized superbranch child node Ai and the generalized superbranch parent node B; and
      eliminating the child node Ai;
    until all generalized superbranch child nodes Ai in the group "A" of generalized superbranch child nodes have been eliminated;
    calculating a total effective ground resistance r'[B] for the generalized superbranch parent node B, by determining the equivalent resistance value of a parallel combination of the ground resistance at generalized superbranch parent node B and each of the contributed effective ground resistances r'(B,Ai) from the generalized superbranch child nodes Ai connected via one of the series resistances to the generalized superbranch parent node B; and
    calculating a total effective ground current i'[B] for the generalized superbranch parent node B by totaling the ground current i'[B] for generalized superbranch parent node B and all of the contributed effective ground currents i'(B,Ai) from each of the generalized superbranch child nodes Ai connected via one of the series resistances to generalized superbranch parent node B;
  until all groups "A" have been operated upon;
  until all generalized superbranches have been operated upon; and
  designating the generalized superbranch root node of each generalized superbranch as a simplified node; and
the step of collapsing each superpath to two simplified nodes further comprises:
  repeating, for each superpath, the steps of:
    setting an effective ground current for the starting node equal to the ground current associated with the starting node;
    repeating, for each intermediate node "A" along the superpath having a next superpath node "B" nearer the ending node, starting with the intermediate node nearest the starting node "S", progressing one node at a time towards the ending node "E", the steps of:
      eliminating the intermediate node A from the superpath;
      calculating and inserting an effective series resistance from the starting node S to the next superpath node B according to:

$$R'(S,B) = R'(S,A) + R(B,A)$$

where R'(S,A) is the effective series between the starting node S and the intermediate node A, and R(B,A) is the resistance between the intermediate nodes A and the next superpath node B;
      calculating an effective ground current at the next superpath node B resulting from the effective ground current associated with intermediate node A according to the equation:

$$i'[B] = \frac{R(S,A)}{R'(S,B)} i'[A] + i'[B]$$

where i'[A] is the effective ground current at the intermediate node A, and i[B] is the ground current associated with the next superpath node B; and
      calculating an effective ground current at the starting node S resulting from an effective ground current at the intermediate node A according to the equation:

$$i'[S] = \frac{R'(B,A)}{R'(S,B)} i'[A] + i[S]$$

where i'[S] is the effective ground current at the starting node, and i'[S] is updated each time it is calculated;
    until all intermediate nodes A have been eliminated; and
    designating the starting node S and the ending node E as simplified nodes;
  until all superpaths have been operated upon.

32. A method of determining the performance of nets of an integrated circuit design according to claim 31, further comprising: comparing the node voltage waveform for each first node of each net against a threshold value to determine a net delay for each such simplified node.

33. A method of determining the performance of nets of an integrated circuit design according to claim 31, further comprising:
  re-expanding the simplified equivalent circuit corresponding to each net to determine a node voltage for each of the first nodes of the net corresponding to the simplified equivalent circuit.

34. A method of determining the performance of nets of an integrated circuit design according to claim 33, further comprising:

comparing the node voltage waveform for each first node of each net against a threshold value to determine a net delay for each such first node.

35. A system for determining the performance of nets of an integrated circuit design, comprising:

a semiconductor design automation system including:
   a computer processor;
   a graphic display device connected to the computer processor;
   one or more mass-storage devices accessible to the computer processor;

an integrated circuit design on the semiconductor design automation system, said integrated circuit design including a net-fist, said net-list including a plurality of nets, each net representing a plurality of interconnected first nodes;

network collapsing software on the semiconductor design automation system, said network collapsing software being operative to collapse nets in the net-list to corresponding simplified equivalent circuits, each simplified equivalent circuit having a plurality of simplified nodes less than the plurality of first nodes; and, network simulation software on the semiconductor design automation system, said network simulation software being operative to determine node voltages for each of the simplified nodes;

the network collapsing software further being operative to:
   identify superbranches of each net, each superbranch including a first subset of the plurality of first nodes, each node in the first subset being a superbranch node;
   collapse each superbranch of each net to a simplified node;
   identify generalized superbranches of each net, each superbranch including a second subset of the plurality of first nodes, each node in the second subset being a generalized superbranch node;
   collapse each generalized superbranch of each net to a simplified node;
   identify superpaths of each net, each superbranch including a third subset of the plurality of first nodes, each node in the third subset being a superpath node, each superbranch node having a ground current associated therewith, one superbranch node from each superbranch being a superbranch root node, the remaining superbranch node being superbranch child nodes;
   collapse each superpath of each net to two simplified nodes;
   for each superpath;
   determine an effective superbranch root node ground current for the superbranch by totaling the ground currents of each superbranch node in the superbranch;
   eliminate all child nodes of the superbranch;
   assign the effective superbranch root node ground current to the superbranch root node; and
   designate the superbranch root node as a simplified node;
   until all superbranches have been operated upon.

36. A system for determining the performance of nets of an integrated circuit design according to claim 35, wherein:
   the network simulation software is of the nodal-matrix type.

37. A system for determining the performance of nets of an integrated circuit design according to claim 35, further comprising:
   network re-expansion software on the semiconductor design automation system, said network re-expansion software being operative to re-expand nets collapsed into corresponding simplified equivalent circuits, and to determine a node voltage for each node of each such re-expanded net.

* * * * *